US006097657A

United States Patent [19]

Ng et al.

[11] Patent Number: 6,097,657

[45] Date of Patent: Aug. 1, 2000

[54] METHOD FOR READING OUT THE CONTENTS OF A SERIAL MEMORY

[75] Inventors: Philip S. Ng, Cupertino; Jinshu Son, Saratoga; Johnny Chan, Newark, all of Calif.

[73] Assignee: Atmel Corporation, San Jose, Calif.

[21] Appl. No.: 09/384,823

[22] Filed: Aug. 27, 1999

Related U.S. Application Data

[62] Division of application No. 09/076,751, May 12, 1998.

[51] Int. Cl.[7] .......... G11C 8/00

[52] U.S. Cl. .......... 365/221; 365/230.02; 365/230.04

[58] Field of Search .......... 365/221, 230.03, 365/230.09, 230.06, 230.04, 230.02

[56] References Cited

U.S. PATENT DOCUMENTS

| | | | |
|---|---|---|---|
| 5,289,413 | 2/1994 | Tsuchida et al. | 365/189.02 |
| 5,325,502 | 6/1994 | McLaury | 395/425 |
| 5,377,155 | 12/1994 | Tamaki et al. | 365/221 |
| 5,450,367 | 9/1995 | Butler et al. | 365/230.09 |
| 5,594,700 | 1/1997 | Ward et al. | 365/230.03 |
| 5,663,922 | 9/1997 | Tailliet | 365/240 |

*Primary Examiner*—Vu A. Le
*Attorney, Agent, or Firm*—Thomas Schneck

[57] ABSTRACT

A serial memory device includes a Y decoder and sensing circuitry which provide a predictive mode of operation, wherein data sensing of a target memory location begins before its address is fully known by sensing the data lines of a number of possible memory locations including the target location. The method and apparatus includes sensing first data bits of possible memory locations when some but not all of the address bits are clocked in. As additional address bits are clocked in, additional data bits are sensed. By the time the target address has been fully received, sensing of its first data bits will have completed so that serial outputting of the target memory can begin on the next clock. This sense-ahead feature permits an increase in the internal clock frequency without affecting external timing constraints imposed by the various serial memory device interfaces.

24 Claims, 16 Drawing Sheets

METHOD FOR READING OUT THE CONTENTS OF A SERIAL MEMORY

CROSS-REFERENCE TO RELATED APPLICATION

This is a divisional of application Ser. No. 09/076,751 filed May 12, 1998.

TECHNICAL FIELD

The present invention relates generally to serial access memory devices and more particularly to an access method and architecture which permits a pipelined approach to reading out the contents of such devices.

BACKGROUND ART

Serial memory devices typically have a single input pin and a single output pin for providing I/O. Although there are many product specific and proprietary protocols for accessing such devices, many industry standards are known and are in the public domain. For example, $I^2C$ is a two wire standard, Microwire is a three wire standard, and the serial peripheral interface (SPI) is a four wire standard.

An advantage of using a non-standard protocol is that the memory device and its interface can be custom designed to provide very high speed access. However, the sacrifice is that such devices are typically suited for very specific applications and thus not readily adapted for general use. More importantly, with such devices there is now only a single vendor of the device. On the other hand, a standard interface such as SPI offers the advantages of a universal interface. Such an approach, however, typically results in a device having less than optimal performance characteristics.

In accordance with the specification for reading out memory in SPI compliant devices the address bits of the target memory location are serially shifted in on each rising clock edge, starting with the most significant bit. After clocking in the last address bit the most significant bit of the target byte is latched out on the falling clock edge immediately following the last address bit. Thus, from the time the device receives the last bit of the address, roughly one-half of a clock cycle is available for the following sequence of events to occur: the memory page must be selected; the bits of the selected byte within the page must be sensed; and the most significant bit must be ready to be clocked out.

Each of these events incurs a delay. For example, capacitive loading imposes a delay due to the time needed to charge up the selected word line and the data lines of the selected memory location. Additional time then is needed for the sense amps to detect the state of each of the data lines (i.e. bits) comprising the memory location. This series of events imposes an upper limit on the frequency of operation of the device. The clock frequency cannot exceed the period of time needed to allow for line charging and sense amp operation. Currently, this upper limit is on the order of 2 MHz–5 MHz.

An attempt to increase the read access speed of a serial memory is disclosed in U.S. Pat. No. 5,663,922. The '922 patent discloses a serial memory device wherein the memory array is decomposed into two half-arrays (M1, M2, FIG. 1). Upon receiving all but the last bit of an address, each half-array is accessed to produce a byte therefrom. Each half-array has associated read circuitry (SA1, SA2) for sensing the eight bits comprising a byte, namely a bank of eight sense amps for each half-array. The outputs of the read circuitry feed into a multiplexer (MUX's ). The multiplexer controlled to assert the appropriate byte based upon the last address bit received.

A point worth noting in the '922 patent is that additional circuitry is required to support a memory array that is divided into a multiplicity of sub-arrays. This adds to the complexity and the cost of manufacturing such a device. More significantly, a bank of sense amplifiers is needed for each sub-array to sense the accessed byte in that sub-array. Sense amplifiers are notorious for their consumption both of silicon real estate and power. Thus, while the device of the '922 patent offers some reduction in read access time, the size and power burdens of the circuitry which provides such capability outweigh the benefits realized by the circuitry.

What is needed is high speed read access in a serial memory which can be achieved without excessive circuitry. It is a further desire to provide such capability without excessive power requirements.

SUMMARY OF INVENTION

In accordance with the present invention, a method of accessing a serial memory includes serially clocking in the N address bits of a target memory location. When some number of address bits less than N have been clocked in the memory array is accessed. The partial address corresponds to two or more possible memory locations, including the target location. The data lines of each possible location are selected and sensed. More specifically, only a subset of the data lines of each such location is sensed. Upon receiving a subsequent bit of the target address the address range is reduced by one half and consequently the number of possible locations is halved. Of the reduced possible memory locations, which still includes the target location, a second subset of data lines is selected and sensed, in addition to the first subset of data lines already being sensed. Thus, sensing of some of the bits of the target location begins though its entire address has not yet been received. More significantly, since less than all of the data lines are being sensed, the number of sense amps needed for the operation is kept to a minimum.

In one embodiment of the invention some of the sense amplifiers are reused upon receiving subsequent bits of the target address, thus further reducing the number of sense amps needed for reading out the target location. This is possible because the number of possible locations is reduced by one-half upon receiving a subsequent address bit.

BEST MODE OF CARRYING OUT THE INVENTION

Figure 1:
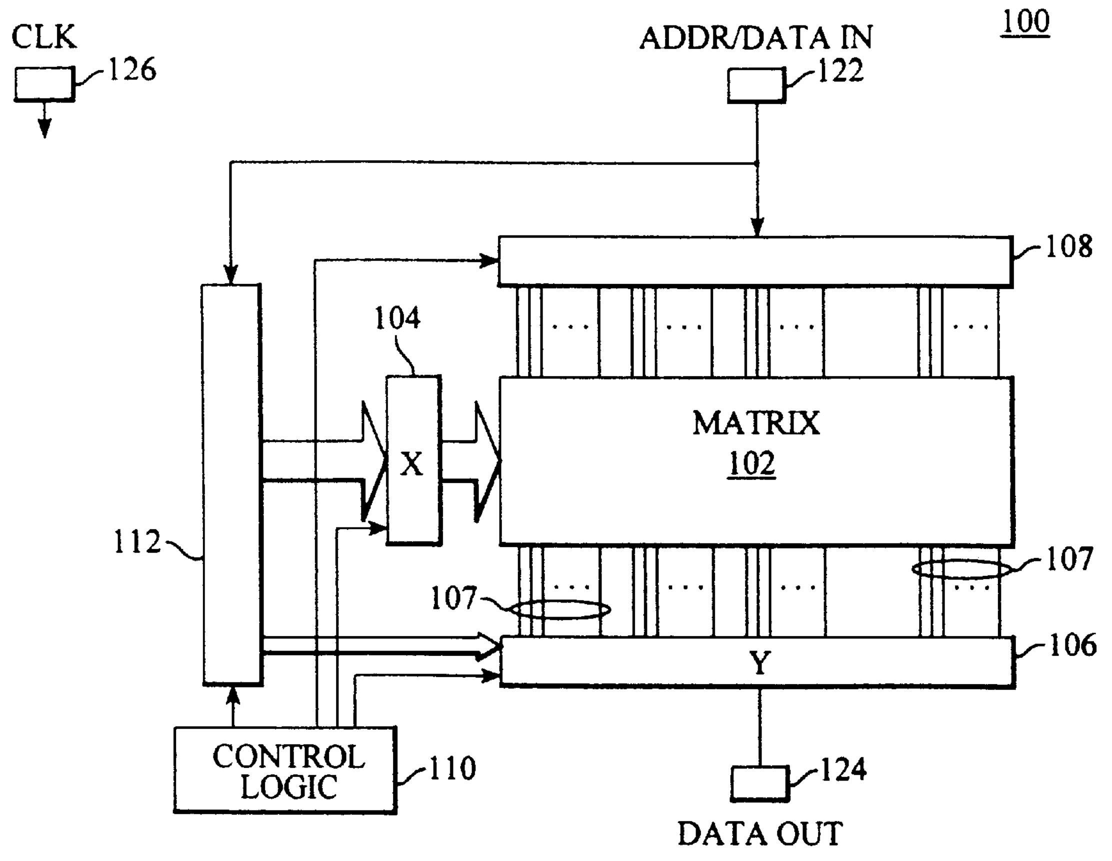
FIG. 1 is a block diagram of a serial memory device.

The serial memory device 100 of FIG. 1 operates in conformance with the SPI standard, though the invention does not require the SPI interface and is readily adapted to other bus standards such as the $I^2C$ or the Microwire standards. Serial memory 100 comprises external pads including address/DATA IN pad 122 for serially inputting address and data bits, DATA OUT pad 124 for serial data output, and clock pad 126 for an externally provided clock signal.

A memory matrix 102 comprises a plurality of memory locations, organized into rows and columns. Each row (aka page) of memory is addressed by an X portion of the memory address, and each column of memory within a page is addressed by a Y portion of the memory address. Each column of memory consists of a set of bit lines 107, typically eight bits, comprising the memory location. The bit lines 107 from each column feed into a Y decoder 106.

For explanatory purposes only, it is assumed that memory device 100 uses 16-bit addressing, and more specifically that the X portion of the address occupies the upper 12 bits $A_{15}$–$A_4$ and the Y portion occupies the lower 4 bits $A_3$–$A_0$ of the address word. It is further assumed that each memory location is an eight-bit datum. Thus, memory matrix 102 is a 4096 row×16 column array, each column consisting of eight bit lines. It should be clear, however, that the invention can be readily scaled up or down to accommodate other address sizes and differently sized X and Y portions of the address word. A data size other than eight bits can also be used.

Address/DATA IN pad 122 feeds into an address buffering circuit 112. The address buffering circuit provides the X portion of a target address and the Y portion as well. The X portion of the address feeds into an X decoder 104 which is coupled to memory matrix 102 and selects the specified memory page. The Y portion of the address feeds into Y decoder 106 which selects the specified memory location in the selected page. As will be shown below, Y decoder 106 includes the sense circuitry for sensing the bit lines of an accessed memory location. Y decoder 106 further includes circuitry for outputting the bits of the target location on DATA OUT pad 124.

Address/DATA IN pad 122 accepts an externally provided serial bit stream and feeds it into an input buffer 108. As will be explained below, input buffer 108 includes circuitry for storing a bitstream to be written to a page or a portion thereof. Control logic 110 provides control signals and timing signals for operating the various components comprising the memory device 100.

The construction of Y decoder 106 will now be discussed with reference to FIG. 2. The Y decoder of the present invention comprises a decoder circuit 200 which receives, as input, the eight bit lines 107 from each column in memory matrix 102. Recall that for the purpose of explanation the memory array is a 4096 row by 16 column array of eight-bit data. Thus, the number of bit lines feeding into decoder circuit 200 is 128 (16×8). Decoder circuit 200 includes a set of eight output data lines D7–D0 for each byte in the array, namely bytes B0–B15, thus providing a one-to-one mapping between the incoming bit lines and the outgoing data lines.

Under the control of address control lines A2_SEL and A1_SEL and address lines $A_3$–$A_0$, decoder circuit 200 can be manipulated to behave as a 16-to-4 decoder, a 16-to-2 decoder or a 16-to-1 decoder. With only A2_SEL asserted, the decoder circuit will output the data lines of the four bytes whose upper two address bits are equal to $A_3$, $A_2$. With only A1_SEL asserted, the decoder circuit will output the data lines of the two bytes whose upper three address bits are equal to $A_3$, $A_2$, $A_1$. Finally, when neither A2_SEL nor A1_SEL are asserted decoder circuit 200 will produce the one byte addressed by address bits $A_3$–$A_0$.

Figure 3A:
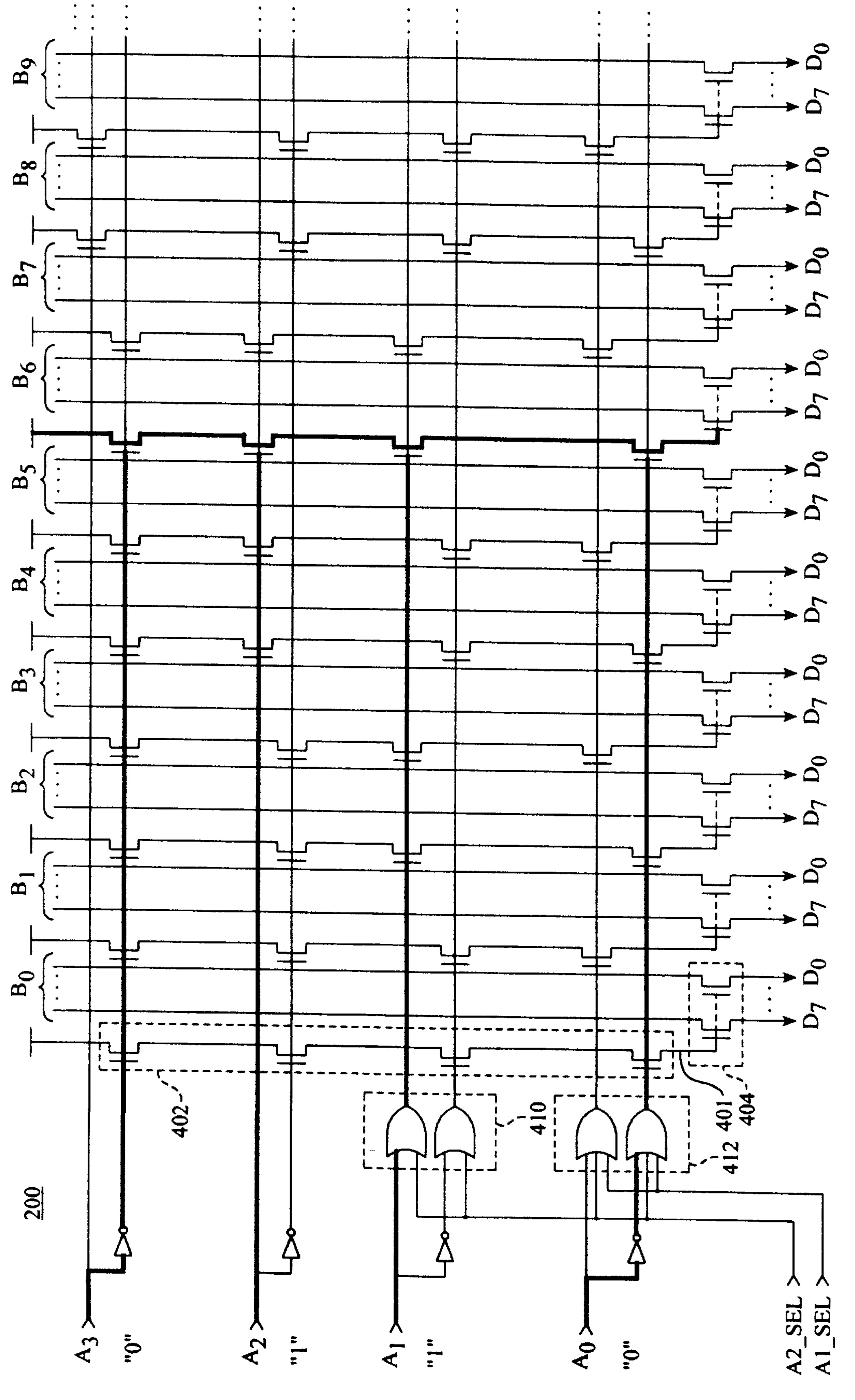
FIGS. 3A and 3B show a typical implementation of the decoder circuit shown in FIG. 2.

Turn now for a moment to FIG. 3A where a typical implementation of decoder circuit 200 is shown. Each byte has an associated chain of decoding transistors 402. Decoding of a given byte occurs by coupling its decoding transistors to the appropriate address lines, $A_3$–$A_0$ and/or its complements. Each byte also has an associated set of pass transistors 404 which gate its corresponding data lines D7–D0. The pass transistors 404 for a given byte are switched by the terminus line 401 of the decoding chain 402 corresponding to that byte. Thus, for example, if address lines $A_3$–$A_0$ are presented with "0110" then the address will be decoded by the decoding chain for byte 6, shown in bolded lines in FIG. 3A. Its corresponding pass transistors will be turned on via the terminus line 401, thus passing its data lines D7–D0 through to the output of decoder circuit 200.

Figure 3B:
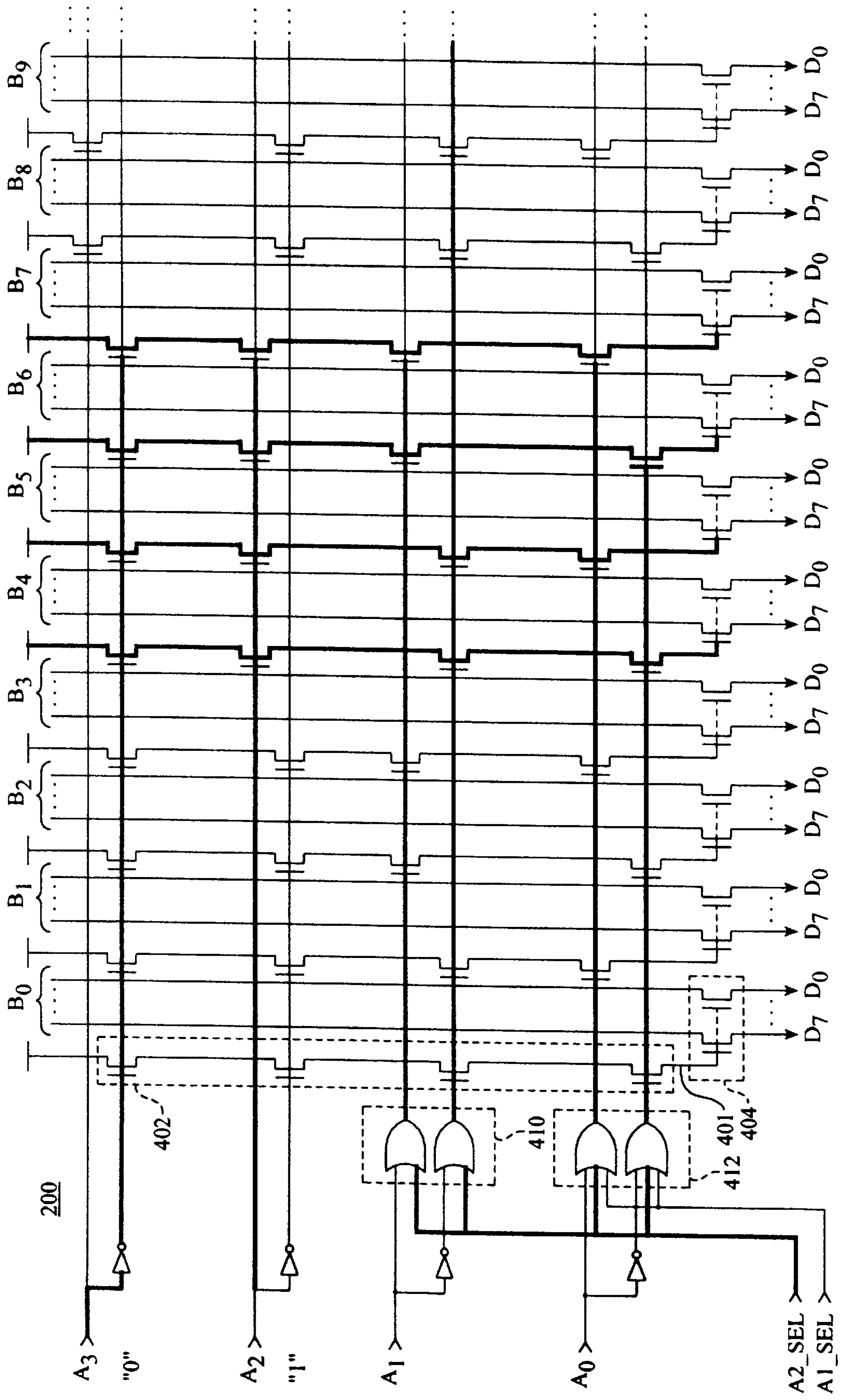

As mentioned above the A2_SEL and A1_SEL control lines modify the behavior of decoder circuit 200. This is accomplished through the use of OR gates 410, 412. Address line A1 and the A2_SEL line feed into OR gates 410. Address line A0 and both the A2_SEL and A1_SEL lines feed into OR gates 412. Address bits A1 and A0 represent the low order bits of the address. When A2_SEL is asserted all four combinations of $A_1$ and $A_0$ are forced, so that specifying bits $A_3$ and $A_2$ causes decoder 200 to output the following four bytes: $A_3$,$A_2$,0,0; $A_3$,$A_2$,0,1; $A_3$,$A_2$,1,0; and $A_3A_2$,1,1, irrespective of $A_1$ and $A_0$. For example, FIG. 3B shows in bold lines the activated bytes when $A_3$=0, $A_2$=1 and A2_SEL is asserted. Hence, asserting A2_SEL causes decoder circuit 200 to behave as a 16-to-4 decoder. Similarly, when A1_SEL is asserted both combinations of $A_0$ address line are forced. Thus, specifying A3, A2 and A1 will produce the following two bytes: $A_3$,$A_2$,$A_1$,0 and $A_3$,$A_2$,$A_1$,1. Hence, asserting A1_SEL results in a 16-to-2 decoder.

Figure 2:
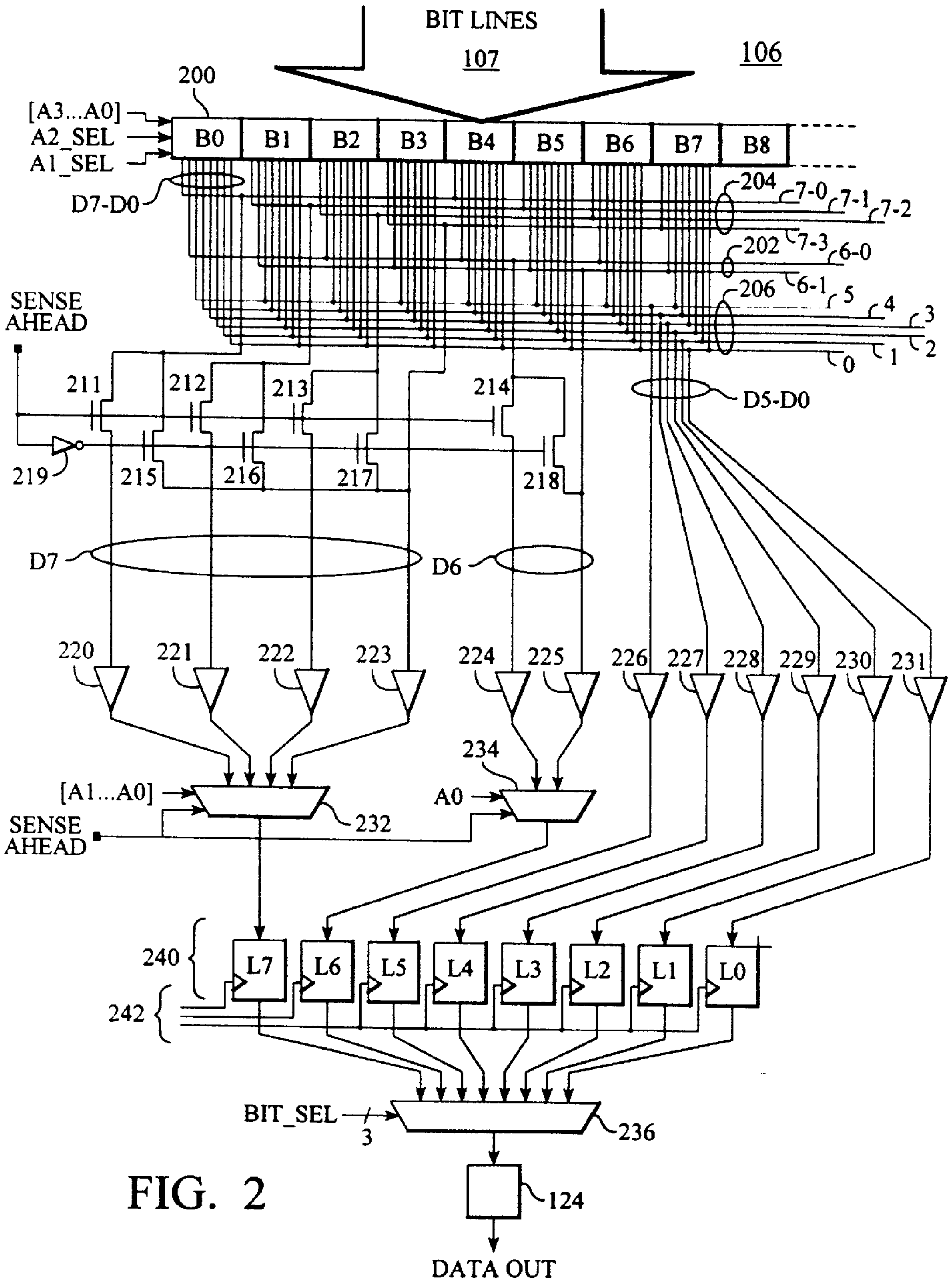
FIG. 2 shows a logic diagram of the Y decoder circuit shown in FIG. 1 designed in accordance with the present invention.

Return now to the description of the Y decoder 106 shown in FIG. 2. The data lines of decoder circuit 200 are variously coupled to a four-wire bus 204, a two-wire bus 202, and a six-wire bus 206. The four-wire bus 204 consists of wires 7-0, 7-1, 7-2, and 7-3. The two-wire bus 202 consists of wires 6-1 and 6-0. The six-wire bus 206 consists of wires 5, 4, 3, 2, 1, and 0.

Each wire of the four-wire bus 204 couples together the most significant bit, namely the D7 data line from decoder 200, of every fourth byte. Thus, wire 7-0 couples together the D7 data line of every fourth byte beginning with byte B0. Wire 7-1 couples together the D7 data line of every fourth byte beginning with byte B1. Wire 7-2 couples together the D7 data line of every fourth byte beginning with byte B2. Wire 7-3 couples together the D7 data line of every fourth byte beginning with byte B3. In the example where the array consists of 16 columns of bytes, the D7 bit of bytes B0, B4, B8, and B12 are coupled together by wire 7-0; the D7 bit of bytes B1, B5, B9, and B13 are coupled together by wire 7-1; the D7 bit of bytes B2, B6, B10, and B14 are coupled together by wire 7-2; and the D7 bit of bytes B3, B7, B11, and B15 are coupled together by wire 7-3.

Next is the two-wire bus 202. Here, the data line of the second most significant bit (D6) of every other byte is coupled to either the 6-0 wire or the 6-1 wire. Specifically, the second most significant data line of every other byte starting with byte B0 is coupled to wire 6-0 and the second most significant data line of every other byte starting with byte B1 is coupled to wire 6-1. Thus, the D6 line of the even bytes beginning with B0 are coupled to wire 6-0. Similarly, the D6 line of the odd bytes are coupled to wire 6-1.

Finally, the six-wire bus 206 couples together each of the six remaining data lines (D5–D0) of every byte. Thus, the D5 data line of each byte is coupled to wire 5 of the six-wire bus, the D4 data line of each byte is coupled to wire 4, the D3 data line of each byte is coupled to wire 3, and so on as shown in FIG. 2.

Ignoring for the moment the routing through transistors 211–218, Y decoder 106 further includes sense circuitry (sense amps) 220–231, each having an input coupled to a wire from one of the buses 202–206. Thus, wire 7-0 of four-wire bus 204 is coupled to the input of sense circuit 220 to read the data on wire 7-0. Similarly, wire 7-1 of four-wire bus 202 is coupled to the input of sense circuit 221 to read the data on wire 7-1, and so on. Coupled in this manner, sense circuits 220–223 read out the most significant bit (D7) of every four contiguous bytes, e.g. bytes B0–B3, B4–B7, and so on. In like manner, sense circuits 224 and 225 read out the next most significant bit (D6) of every two contiguous bytes, e.g. bytes B0 & B1, B2 & B3, B4 & B5, and so on. Finally, sense circuits 226–231 read out the remaining bits (D5–D0) of every byte.

The outputs of sense circuits 220–223 each feeds into a 4:1 selector 232. Selector 232 is controlled by address lines $A_1$, $A_0$, the output of which feeds into position L7 of latch 240. The outputs of sense circuits 224 and 225 feed into a 2:1 selector 234. Selector 234 is controlled by address line $A_0$, the output of which feeds into position L6 of latch 240. Finally, the outputs of sense circuits 226–231 each feeds into respective positions L5–L0 of latch 240. Latch control lines 242 are driven by control logic 110 to provide a timed latch sequence for latching in data from the sense circuits 220–231. The outputs of latch 240 feed into an 8:1 selector 236, which is controlled by a selector control BIT_SEL. The output of selector 236 is coupled to output pad 124.

Return now to transistors 211–218. Transistors 211–214 couple the individual wires of four-wire bus 204 and two-wire bus 202 to their respective sense circuits. Transistors 215–217 couple all four wires of four-wire bus 204 into sense circuit 223. Similarly, transistor 218 couples the two wires of two-wire bus 202 into sense circuit 225. Transistors 211–214 are turned on when control signal SENSE-AHEAD is HI, while transistors 215–218 are turned on through inverter 219 when SENSE-AHEAD is L0.

In accordance with the SPI interface, the address bits of the target memory location are serially shifted in on each rising clock edge, starting with the most significant bit. After clocking in the last address bit the most significant bit of the target byte is latched out on the falling clock edge immediately following the last address bit.

Figure 4A:
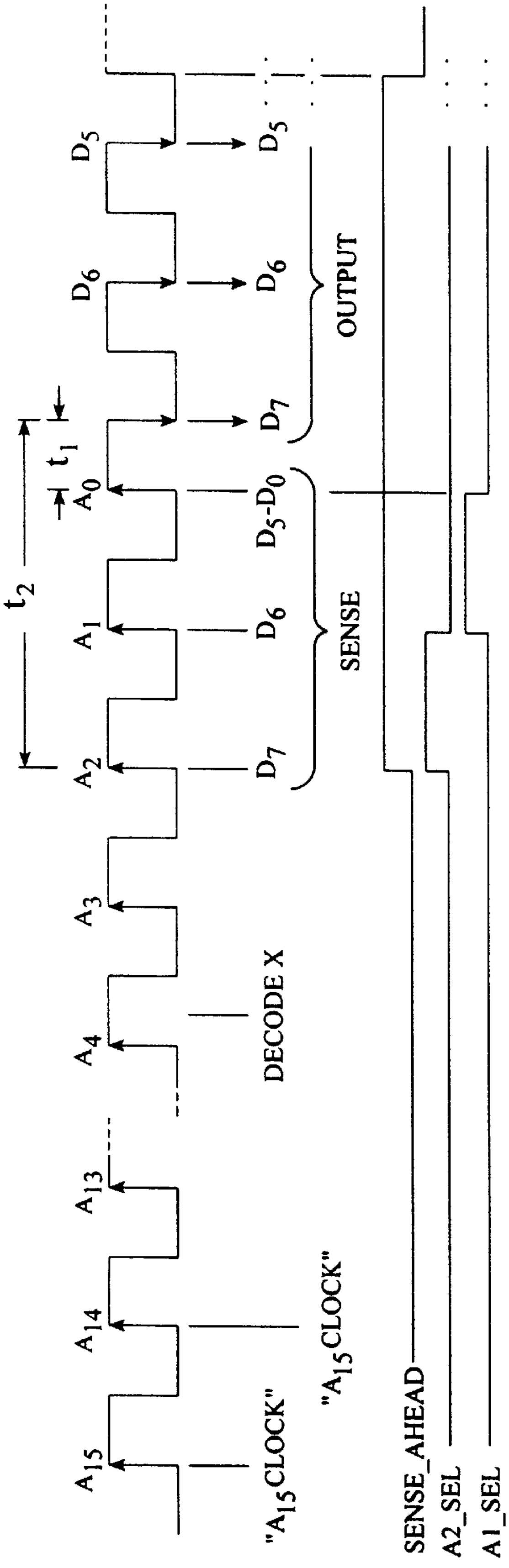
FIGS. 4A–4B are timing charts, showing the relative timing of the address bits and the data bits in accordance with various embodiments of the present invention.

Operation of the present invention will now be described with reference to FIGS. 1, 2, 4A, 4B, 5, and 6A–6C. In FIG. 4A, each rising clock edge is identified with respect to the address bit being clocked in; for example, address bit $A_{15}$ is shifted in on the $A_{15}$ clock, address $A_{14}$ is shifted in on the $A_{14}$ clock, and so on.

Each address bit of the target is shifted in serially until the high order bits $A_{15}$–$A_4$ comprising the X portion of the target address have been shifted in, steps 502, 503. At clock $A_4$ the X portion of the target address is sent to the X decoder 104. This is accomplished by properly buffering the incoming address bits in address buffer circuit 112 and transmitting the X portion to the X decoder when bits $A_{15}$–$A_4$ have been received. The row (page) in which the target byte is located is therefore known. Next, the address bits of the Y portion of the target address are shifted in while the row is being selected by X decoder 104, steps 504A, 504B.

Figure 5:
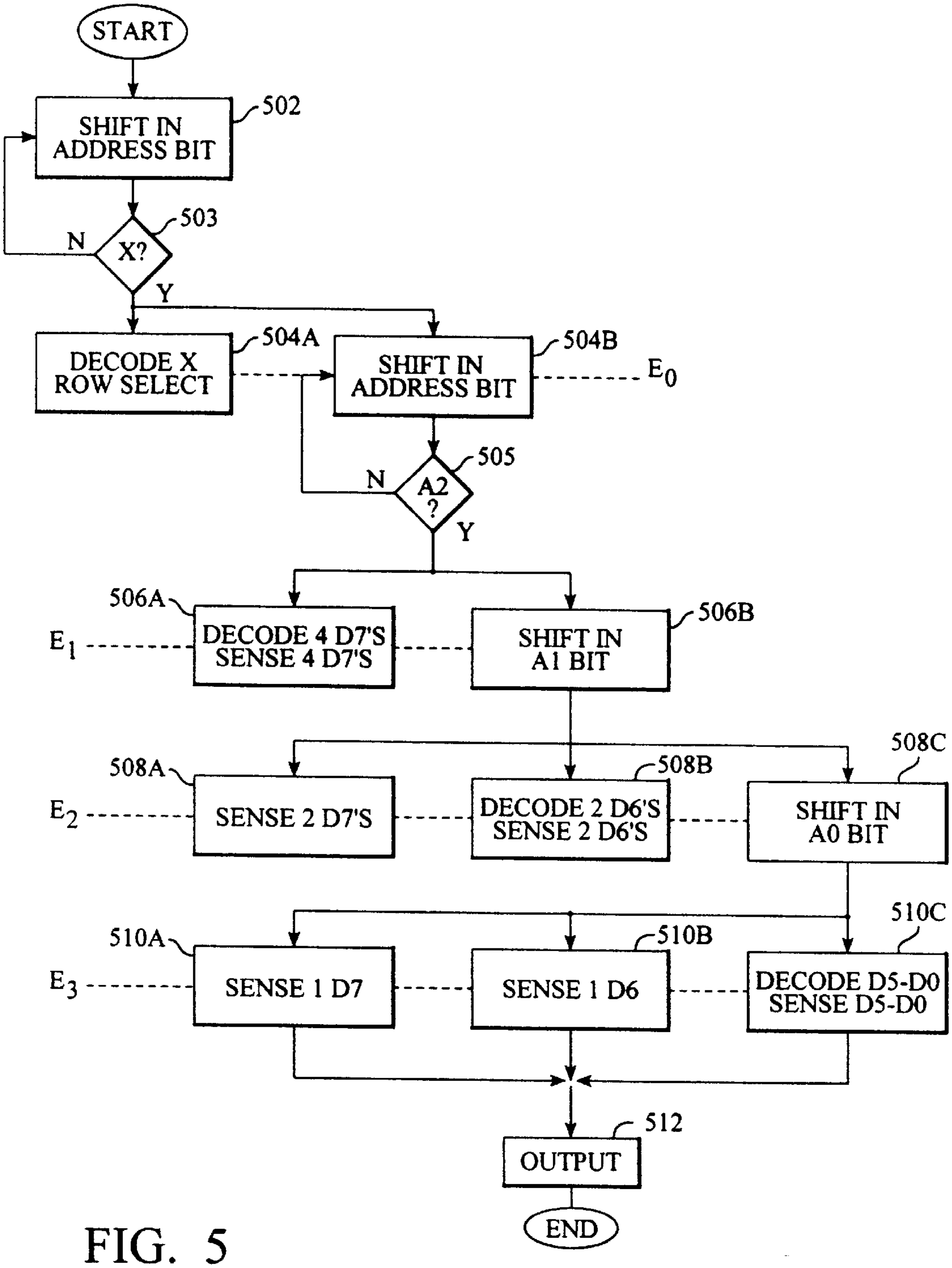
FIG. 5 is a flow chart of the operation of the present invention.

Page selection and receiving of the next address bit are concurrent operations as represented in FIG. 5 by the dashed line, identified as event $E_0$, passing through steps 504A and 504B. Address bits are received until the $A_2$ bit has been shifted in, steps 504B, 505.

At the $A_2$ clock shown in FIG. 4A address bits $A_3$ and $A_2$ have been received and address buffering circuit 112 feeds these two address bits into Y decoder 106. Control logic 110 asserts A2_SEL to decoder circuitry 200 so that the data lines of the four bytes in the selected row having the same $A_3$, $A_2$ address bits are produced, step 506A. Assuming that the target byte is located in byte position B5 of the selected row, i.e. $A_3$, $A_2$ are "01", bytes B4 ("0100"), B5 ("0101"), B6 ("0110"), and B7 ("0111") are produced. Control logic 110 also holds the SENSE-AHEAD control line HI so that the four D7 data lines of the four selected bytes are coupled to and sensed by the four sense circuits 220–223. At the same time, the next address bit is shifted in, step 506B. Event line $E_1$ indicates the concurrency of these two events.

Figure 6A:
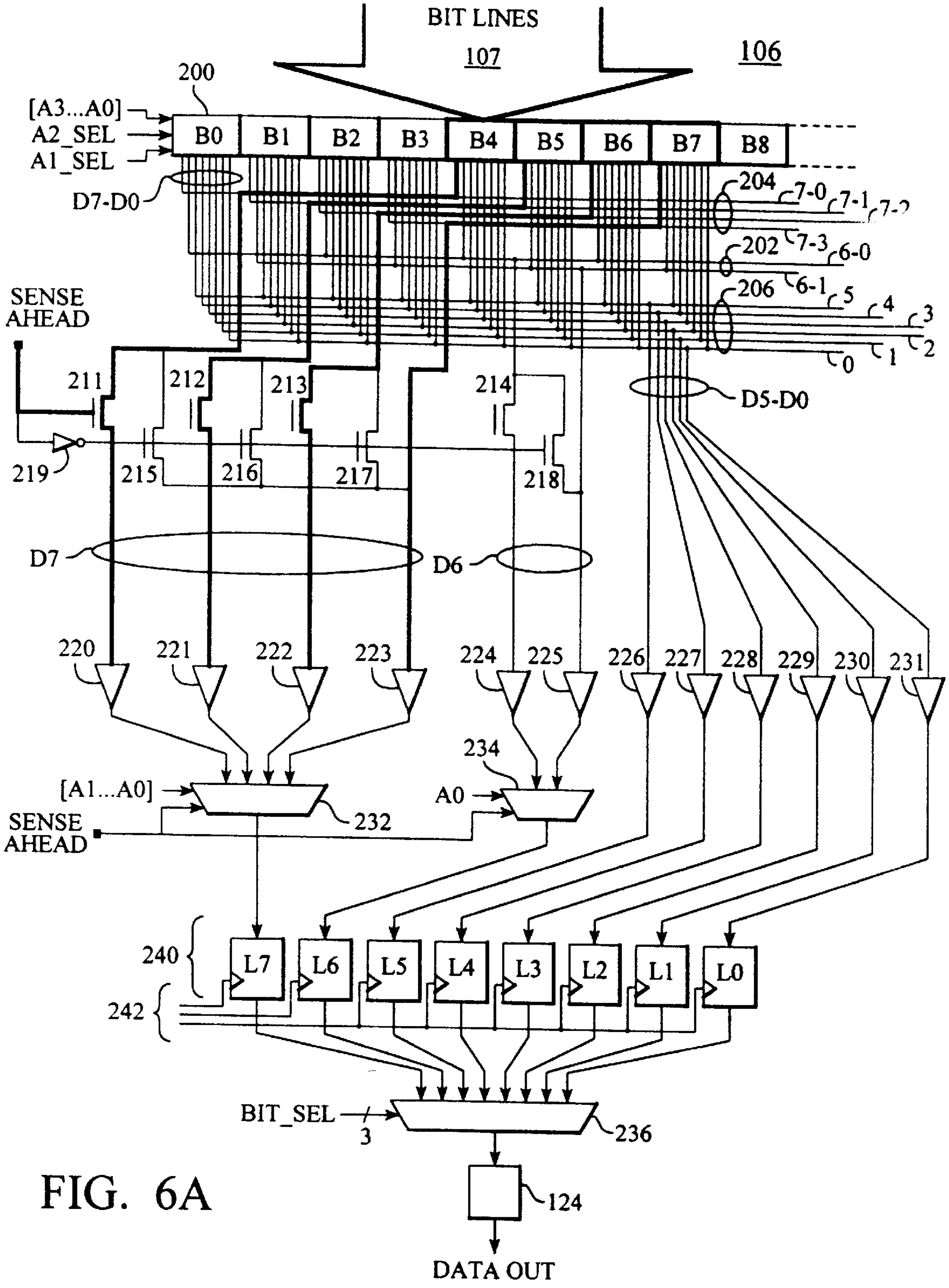
FIGS. 6A–6D show the active lines during operation of the device in accordance with the invention.

FIG. 6A shows the active lines (highlighted) at this time, illustrating the sensing of the D7 data lines. It can be seen that sensing of the target byte B5 has begun before the Y address is fully received. In effect, a prediction of the target byte is being made based on address bits $A_3$ and $A_2$, by sensing the D7 lines of these four bytes. Although not highlighted in FIG. 6A, the four D6 data lines of bytes B4–B7 feed into the two D6 sense circuits 224, 225. At this time, however, the output is indeterminate since each sense circuit is reading the output of two data lines. The outputs of the D5–D0 sense circuits, likewise, are inconsequential since each is receiving four data lines from the four selected bytes. Since the output of sense circuits 224–231 are indeterminate and thus serve no purpose at this time, the sense circuits can be provided with enabling circuits so that they may be turned off in order to conserve power.

Upon receiving the $A_1$ address bit at the $A_1$ clock, control logic 110 asserts A1_SEL and de-asserts A2_SEL to decoder circuit 200. This results in the decoding of high order address lines $A_3$–$A_1$, producing the two bytes having in common those high order address bits, namely "010" in the example where the target byte is byte B5. Thus, bytes B4 and B5 are produced. Consequently, only two of the original four D7 data lines continue to be sensed, step 508A. In addition, sensing now begins for the two D6 data lines of the two selected bytes, step 508B. Prediction of the target byte continues. Meanwhile, the $A_0$ bit is being shifted in. Event line $E_2$ indicates the concurrency of these events.

Figure 6B:
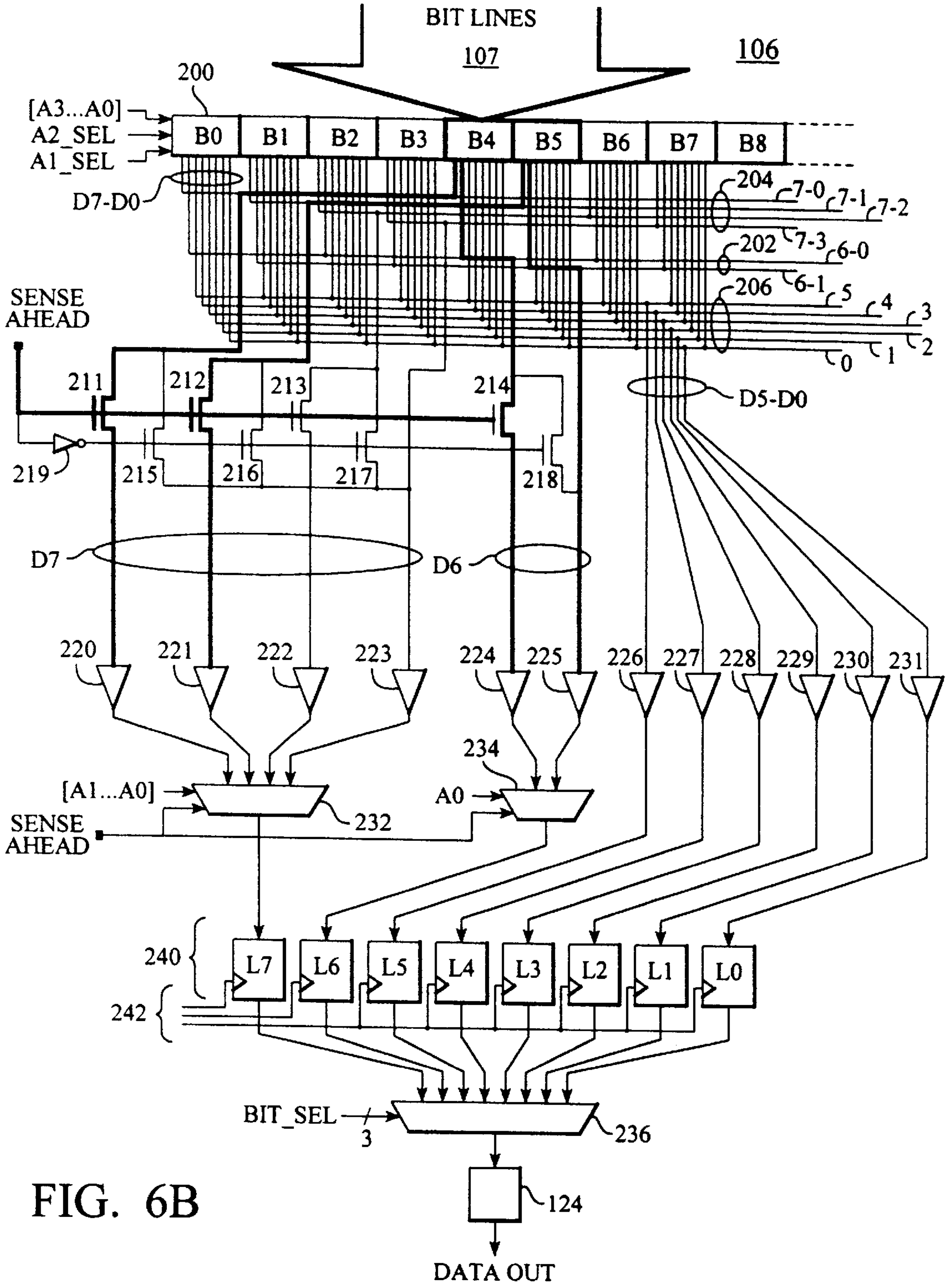

FIG. 6B shows the active lines (highlighted) at this time, illustrating the sensing of the D7 and the D6 data lines. As in FIG. 6A, sense circuits 226–231 each receive data lines D5–D0 from bytes B4 and B5 and therefore their outputs are indeterminate. Thus, sense circuits 226–231 remain in the off condition. Moreover, circuits 222 and 223 can be disabled to conserve power since the target byte is neither B6 nor B7.

Figure 6C:
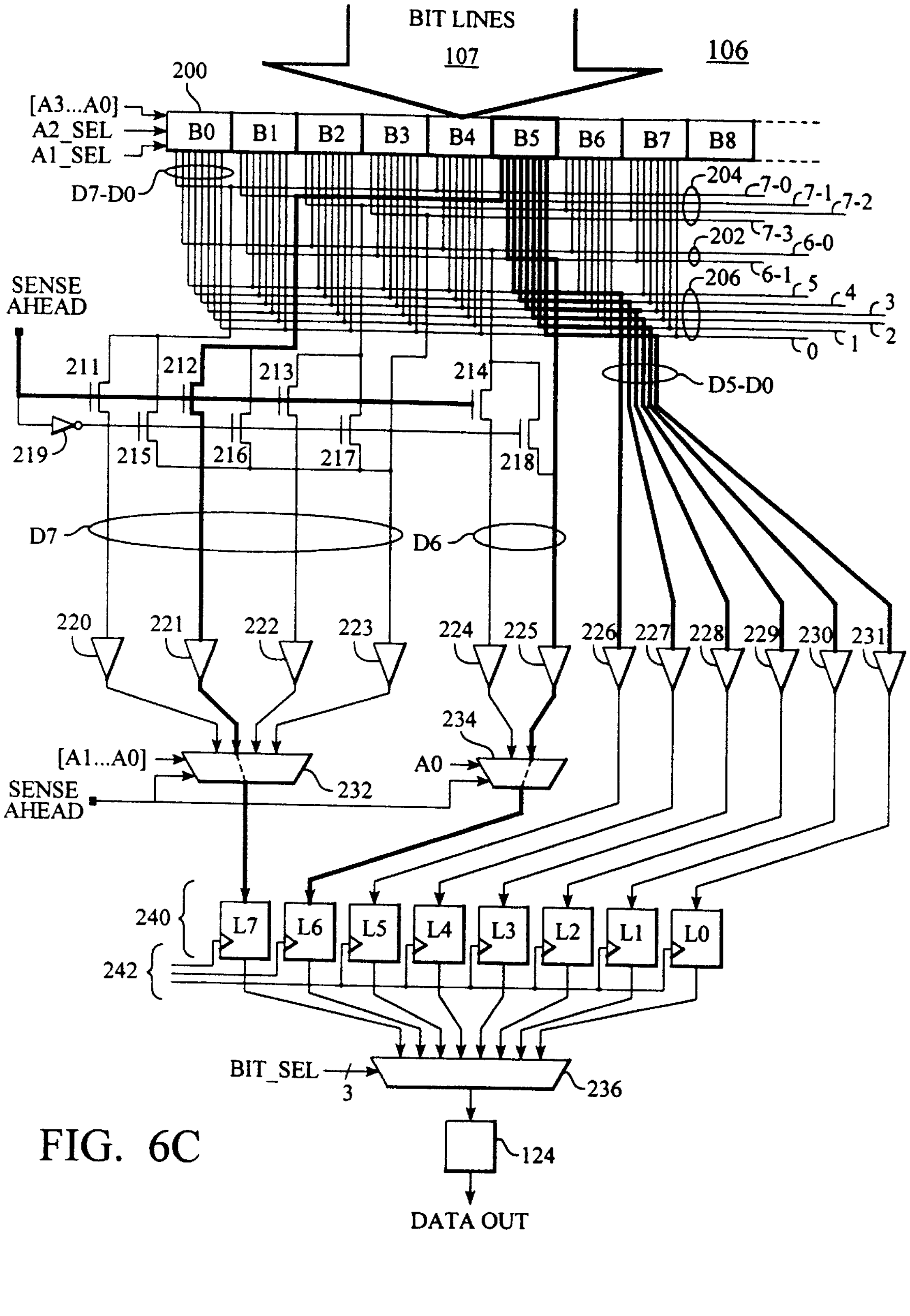

At event $E_3$, when the $A_0$ bit is shifted in during the $A_0$ clock, control logic 110 de-asserts both the A2_SEL and the A1_SEL lines so that decoder circuit 200 will produce the target byte that is addressed by $A_3$–$A_0$, namely byte B5. This leaves only one of the original D7 data lines, step 510A. Moreover, by this time data line D7 will have been sensed and is ready to be shifted out. Meanwhile, only one of the original two D6 data lines remains selected and continues to be sensed, step 510B. At the same time, parallel sensing begins for data lines D5–D0 of the target byte, step 510C. Finally, selectors 232 and 234 select the sense circuit outputs as determined by address bits $A_1$ and $A_0$. Control logic 110 signals latch lines 242 to sequentially latch in D7, D6 and eventually D5–D0. FIG. 6C illustrates the active lines at this point in time. Note that sense circuits 220 and 222–224 can be turned off to conserve power, keeping active sense circuits 226–231.

At the falling edge following the $A_0$ clock, data line D7 of the target byte is shifted out, sensing of the bit having begun five half-cycles earlier at clock $A_2$. Similarly data bit D6 is ready to be shifted out at the next falling edge, shown in FIG. 4A and identified as the D6 clock. Note that sensing of data line D6 also has commenced five half-cycles earlier. Similarly, data line D5 was sensed five half-cycles prior to being shifted out. As to data lines D4–D0, however, sensing of each successive data line will occur for two half-cycles longer than the previous data line. Thus, D4 will have been sensed for seven half-cycles prior to being output, while D0 will have been sensed for fifteen half-cycles.

As previously discussed, prior art SPI-compliant devices must complete row selection and data sensing within the one-half cycle following receipt of the last address bit in order to begin data output at the falling edge. This one-half cycle is shown as $t_1$ in FIG. 4A. The predictive operating mode of the present invention provides a two-fold improvement: first, row selection begins as soon as the X portion of the address is received; second, data sensing of the target byte begins as soon as some of the Y address bits are clocked in. The timing in FIG. 4A shows that the present invention makes available at least five half-cycles of time ($t_2$) for sensing the data bits of the target byte. Thus, the clock used in the present invention device can run faster than that of prior art devices by a factor of five. Actually, the factor is slightly higher than five since, in the present invention, row selection occurs prior to data sensing.

Continuing with the operation of the device, consider the reading out of a subsequent byte. The address buffering circuit 112 simply increments the current address. In the first case, where the next byte is on the same page, this simply involves incrementing the Y portion of the address, the row remaining unchanged. In the second case, where the next byte is on a new page, both the X portion and the Y portion of the address change.

Figure 6D:
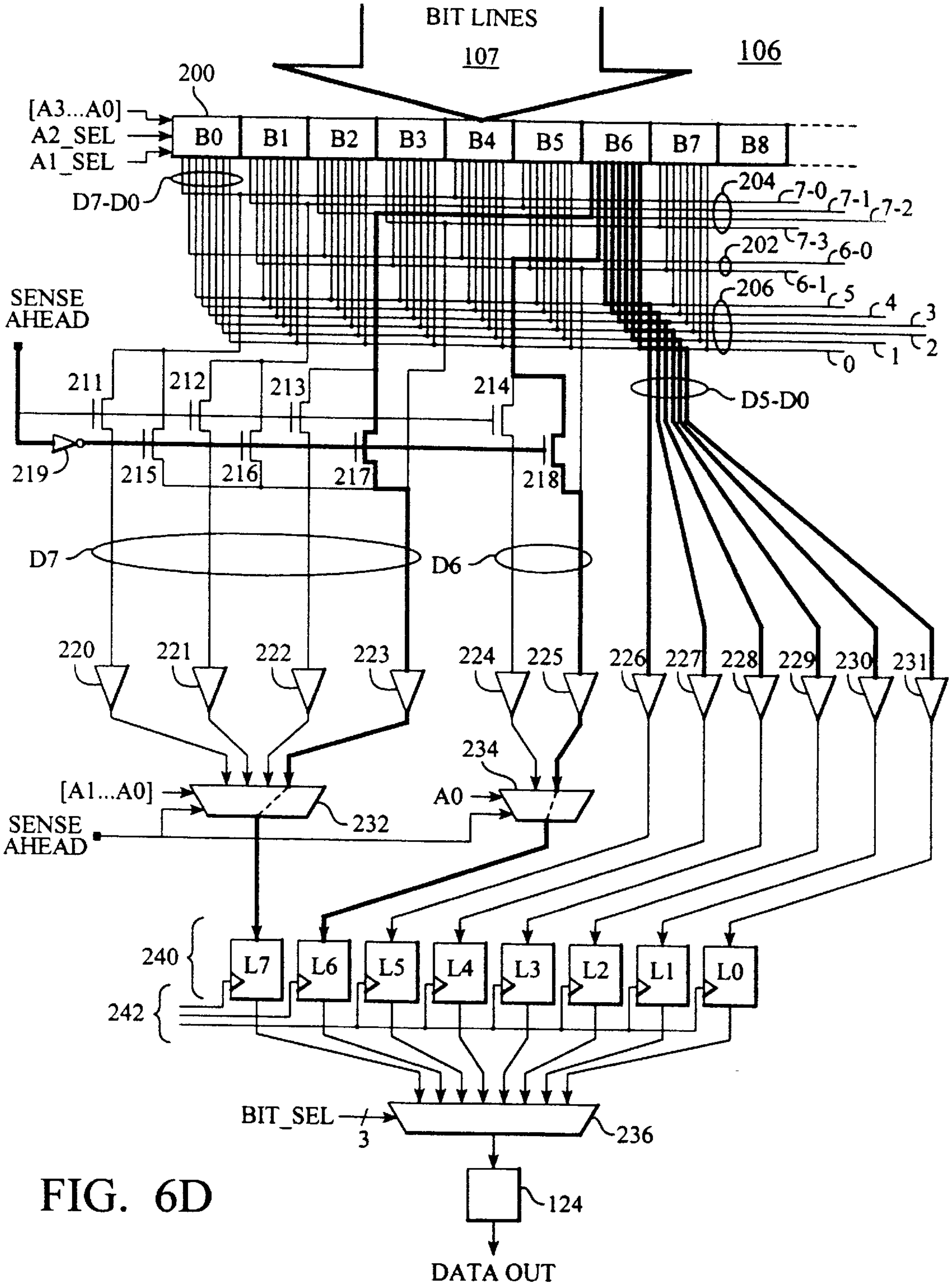

With reference to FIG. 6D, consider the first case, where the next byte is on the same page as the previous byte, namely byte B6. Control logic 110 now de-asserts the SENSE-AHEAD line. This turns off transistors 211–214 and turns on transistors 215–218, thus feeding all of the D7 lines into sense circuit 223 and all of the D6 lines into sense circuit 225. Since the invention is no longer in prediction mode at this time, there is no longer any need to sense more than one D7 or D6 line at a time and so A1_SEL and A2_SEL are de-asserted. Thus, when the address is incremented to select byte B6, only the eight data lines of B6 will feed into their respective sense circuits. Selectors 232 and 234 are further characterized by selecting sense circuits 223 and 225 respectively in response to de-assertion of SENSE-AHEAD. FIG. 6D shows the active lines in this situation.

Figure 4B:
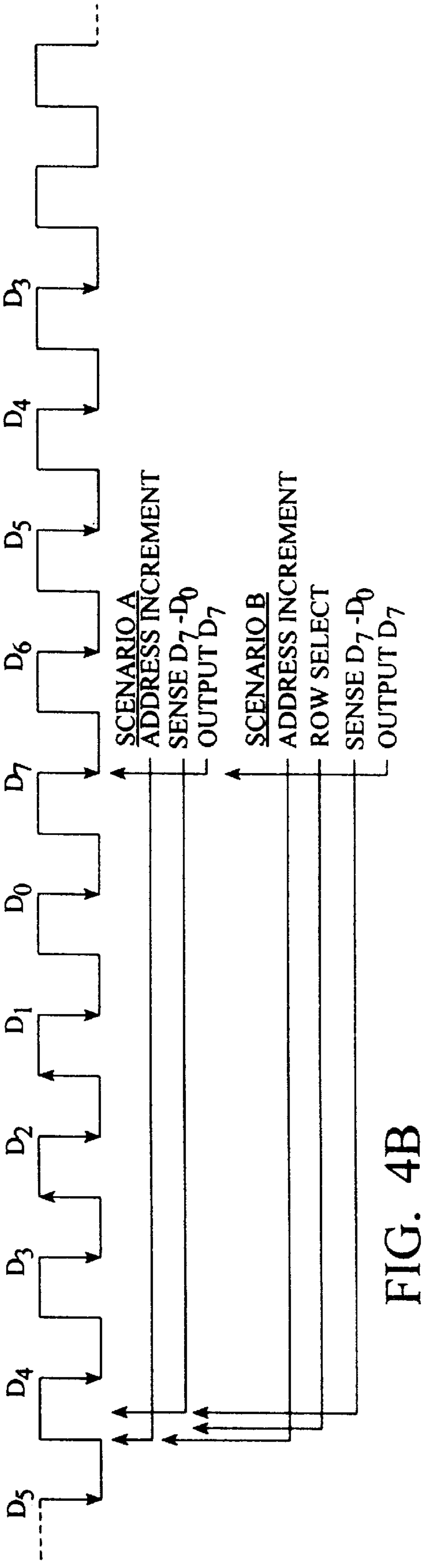

Turning to FIGS. 4A–4B, it can be seen that after the D5 clock, when data bits D5–D0 are latched, the sense circuits become available to sense the next byte. Thus, in scenario A shown in FIG. 4B the address is incremented sometime after the D5 clock. Shortly thereafter data lines D7–D0 of the next byte are sensed. This gives the next byte more than five half-cycles of time to be sensed, so that at clock D7 shown in FIG. 4B, the D7 bit of the next byte is ready to be shifted out.

Consider next the case when the next byte is on a new page. Again, the SENSE-AHEAD line is de-asserted and the address is incremented. This time, the X and Y portions of the address change. Thus, in scenario B of FIG. 4B the address is incremented some time after the D5 clock. However, now a row select must now occur to select the next page. Thus, the step of sensing the first byte of a new page must be delayed for an amount of time. As can be seen from the timing chart, the sensing step can be delayed until the rising edge following the D2 clock, roughly four half-cycles. This ensures that five half-cycles are available for sensing the first byte of the new page. In the preferred embodiment, however, since row selection occurs almost immediately subsequent to the address increment, data sensing of the next byte can begin right away as indicated in FIG. 4B. In both scenarios, plenty of clock cycles are available for a row select and a sensing step because there is always one byte that has already been sensed and stored in latch 240 that is being clocked out.

Figure 7A:
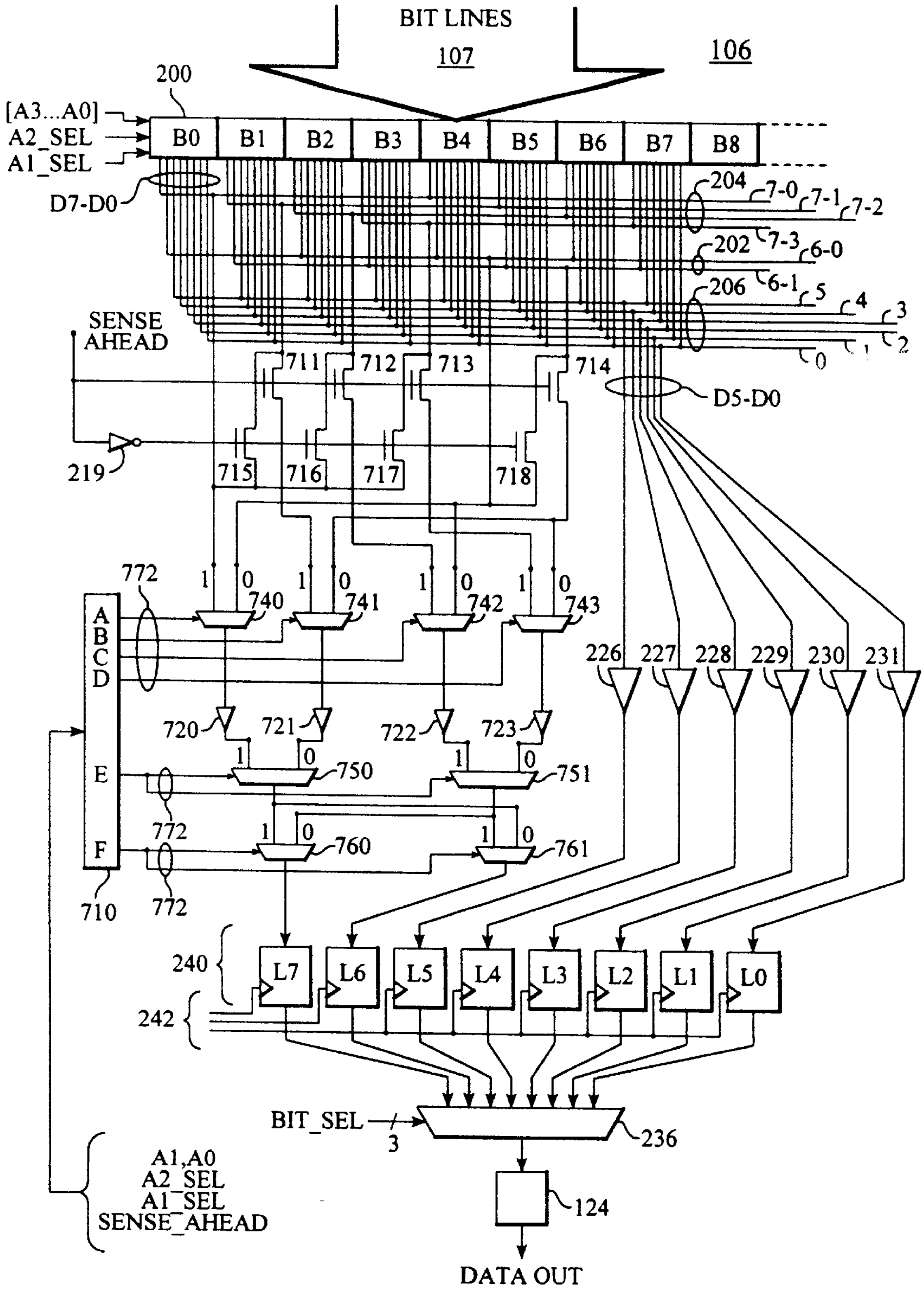
FIGS. 7A–7E show an alternate embodiment of the Y decoder of the present invention and the active lines during its operation.

In the embodiment of the Y decoder shown in FIG. 2, twelve sense circuits are used. Refer now to FIG. 7A for a description of a Y decoder 106 in accordance with the present invention which utilizes ten sense circuits. As will become clear, the reduction in sense circuits is made possible by re-using some of the sense circuits during the decoding of the target byte. Those parts of the Y decoder shown in FIG. 7A which are the same in FIG. 2 retain their original reference numerals. The decoding circuit 200 as shown in FIGS. 2 and 3 is used in this embodiment.

Ignoring for the moment the sense-ahead transistors 711–718, the four wire bus 204 and two wire bus 202 are coupled to mux's 740–743. Each mux is a 2-to-1 selector having a left-side input line designated as the "1" input, a right-side input line designated as the "0" input, and a one-bit mux selector input 772. When the mux selector input is asserted (i.e. HI) the "1" input is produced at its output, and when the mux selector is de-asserted (i.e. L0) the "0" input is produced. This applies for mux's 740–761 shown in FIG. 7A.

The D7 data lines of four wire bus 204 are coupled to the "1" input of mux's 740–743 as shown. Specifically, the 7-0 wire is coupled to the "1" input of mux 740, the 7-1 wire is coupled to the "1" input of mux 741, the 7-2 wire is coupled to the "1" input of mux 742, and the 7-3 wire is coupled to the "1" input of mux 743.

The two-wire bus 202, carrying the D6 data lines, are coupled in alternating fashion to the "0" inputs of mux's 740–743. Thus, the 6-0 wire is coupled to the "0" inputs of mux's 740 and 742, and the 6-1 wire is coupled to the "0" inputs of mux's 741 and 743. The six-wire bus 206 is coupled to sense circuits 226–231 as described above with respect to FIG. 2.

The output of each mux 740–743 feeds respectively into sense circuits 720–723. The output of each sense circuit in turn feeds into two mux's 750, 751. More specifically, sense circuits 720 and 721 feed into the "1" and the "0" inputs of mux 750 respectively, while sense circuits 722 and 723 feed into the "1" and the "0" inputs of mux 751 respectively.

Finally, the outputs of mux's 750 and 751 are cross-coupled to mux's 760 and 761. In particular, mux 750 is coupled to the "1" input of mux 760 and to the "0" input of mux 761, while mux 751 is coupled to the "1" input of mux 761 and to the "0" input of mux 760. The output of mux 760 feeds into the L7 latch of data latch 240 and the output of mux 761 feeds into the L6 data 10 latch. The L5–L0 data latches are coupled to the outputs of sense circuits 226–231 respectively as shown.

Mux controller 710 provides control signals A–F which are coupled to the mux selector inputs 772 of mux's 740–761. The control signals A–F are functions of address bits $A_1$–$A_0$, control lines A2_SEL and A1_SEL, and the SENSE-AHEAD line. The signals A–F are defined by the following logic equations:

A=A2_SEL^(~A2_SEL & ~$A_1$)^~SENSE-AHEAD,

B=A2_SEL^(~A2_SEL & ~$A_1$),

C=A2_SEL^(~A2_SEL & $A_1$& SENSE-AHEAD),

D=A2_SEL^(~A2_SEL & $A_1$),

E=~$A_0$^~SENSE-AHEAD, and

F=~$A_1$^~SENSE-AHEAD, where:

the symbol ^ is logical OR the symbol & is logical AND;

the symbol ~ means complement;

A2_SEL is true at the $A_2$ clock; and

~A2_SEL is true at the $A_1$ and $A_0$ clocks.

The sense-ahead transistors 711–718 serve the same purpose as their counterparts shown in FIG. 2, namely to control the flow of the D7 lines and the D6 lines during prediction mode operation and for subsequently and sequentially accessed memory locations. In FIG. 7A transistors 711–718 are arranged such that when SENSE-AHEAD is L0 all the D7 lines feed into the "1" input of mux 740 and all the D6 lines feed into the "0" input of mux 742.

Figure 7B:
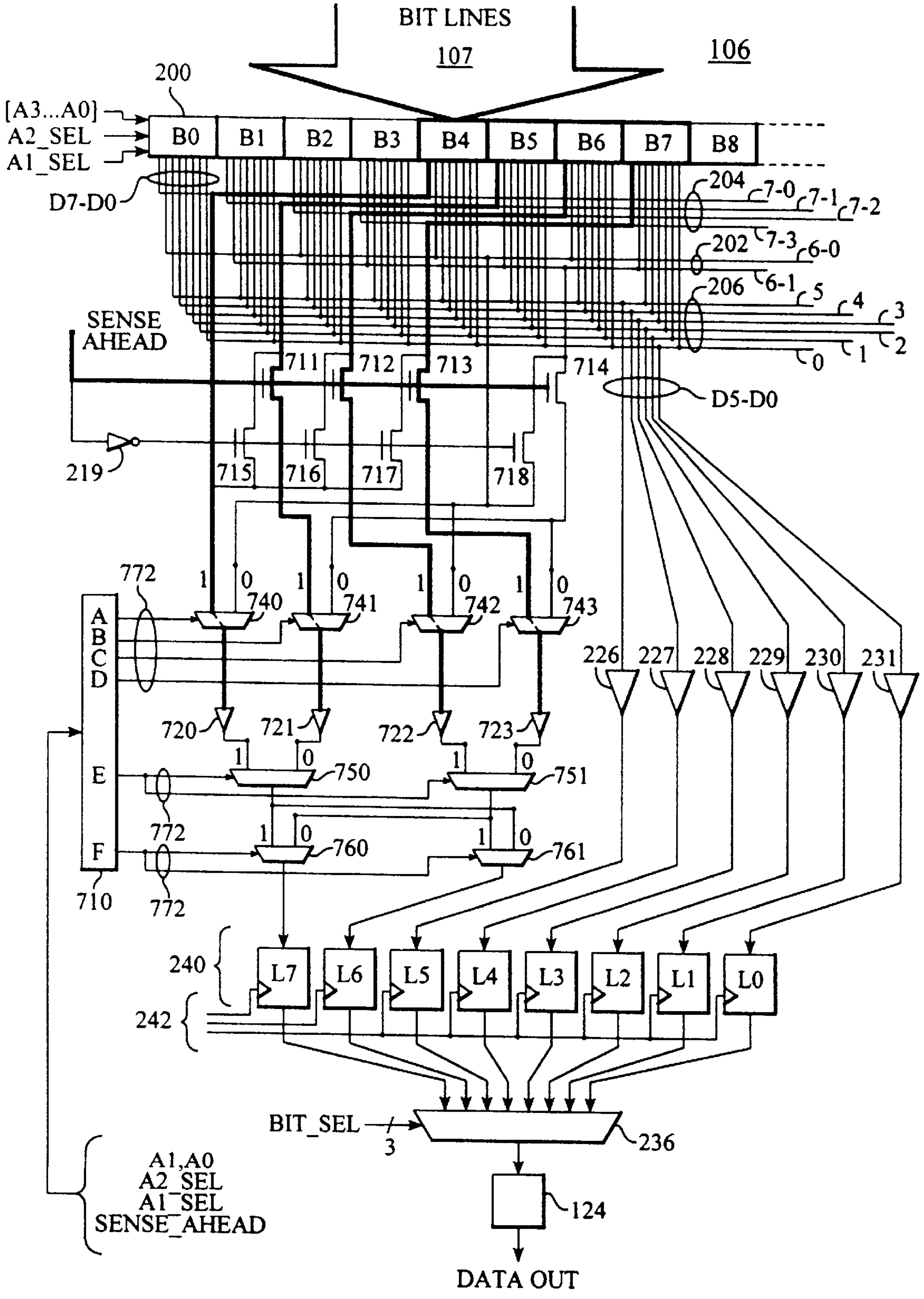

In operation, the Y decoder 106 shown in FIG. 7A proceeds in accordance with the timing diagrams shown in FIGS. 4A and 4B. For the following discussion, refer to FIGS. 7B–7E and assume the target location is byte B6 (Y-portion of the target address, "0110") of the selected row. As before, four candidate bytes are produced by the decoder circuit 200 at the $A_2$ clock, namely bytes B4–B7. With the SENSE-AHEAD line asserted the sense-ahead transistors 711–713 are conductive, sending the four D7 data lines of bytes B4–B7 into the "1" input of each mux 740–743. The A2_SEL line is asserted at this time which, according to the above logic equations, causes mux controller 710 to assert control signals A–D, thereby selecting the "1" input of mux's 740–743 and feeding the D7 lines into sense circuits 720–723. FIG. 7B shows the active lines.

Figure 7C:
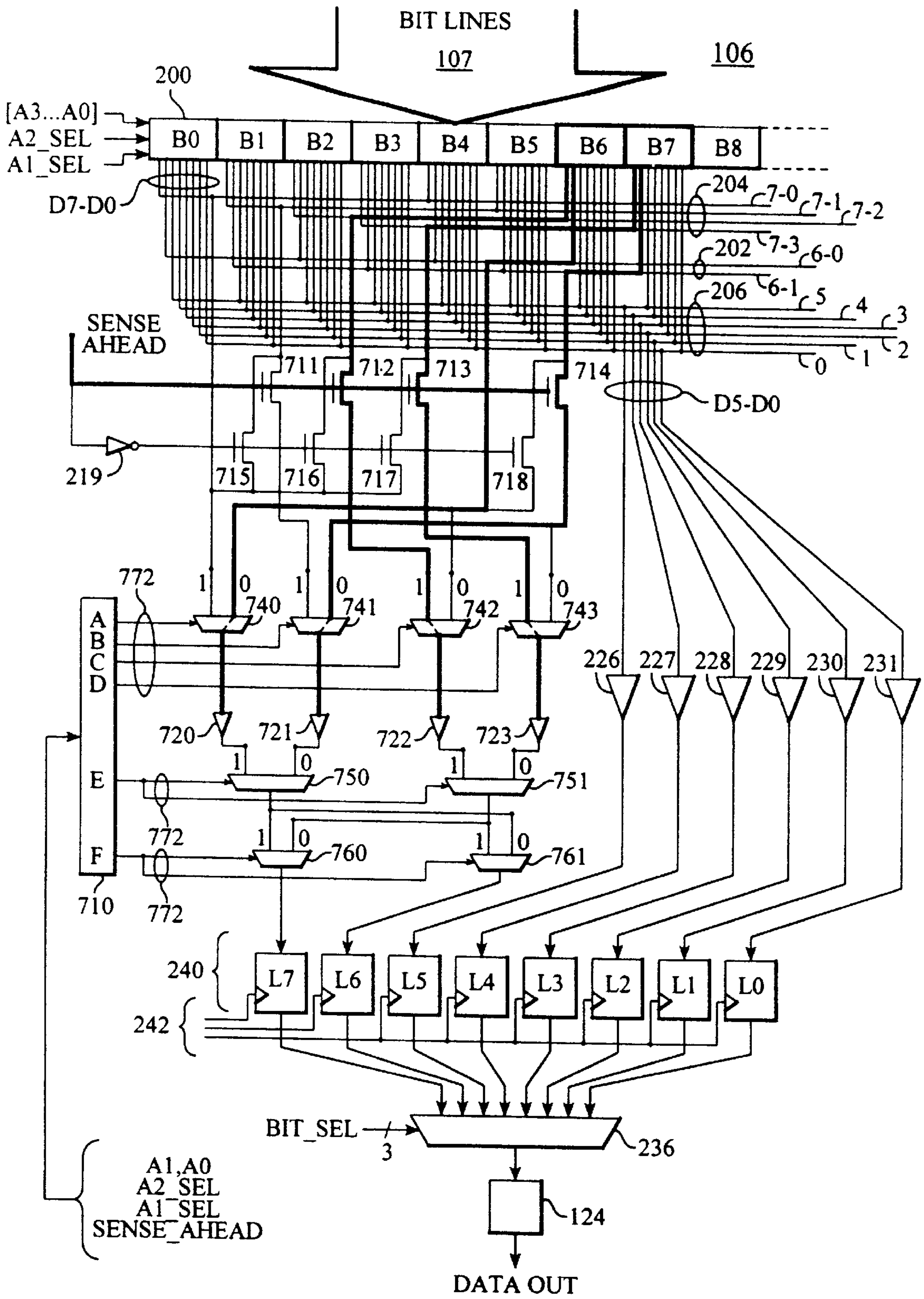

At the $A_1$ clock, decoder circuit 200 produces bytes B6 and B7; i.e. those bytes having in common the same high order address bits: $A_3$–$A_1$, "011". A2_SEL is deasserted at this time and since address bit $A_1$ is "1", mux controller 710 asserts control signals C and D to select the "1" input of mux's 742 and 743. Consequently, mux's 742 and 743 continue to feed the D7 lines of bytes B6 and B7 into sense circuits 722 and 723, while data lines D7 of bytes B4 and B5 are decoupled from sense circuits 720 and 721. Although the idea of decoupling a data line from its sense circuit while the data is being sensed seems counterintuitive, the D7 lines of bytes B4 and B5 are no longer needed, since it is known at this time that neither of bytes B4 and B5 is the target byte. These sense circuits can therefore be re-used. Since A and B from mux controller 710 are L0, the "0" input of mux's 740 and 741 are selected to feed the D6 data lines of bytes B6 and B7 into sense circuits 720 and 721, thus re-using the circuits. FIG. 7C shows the active lines.

Figure 7D:
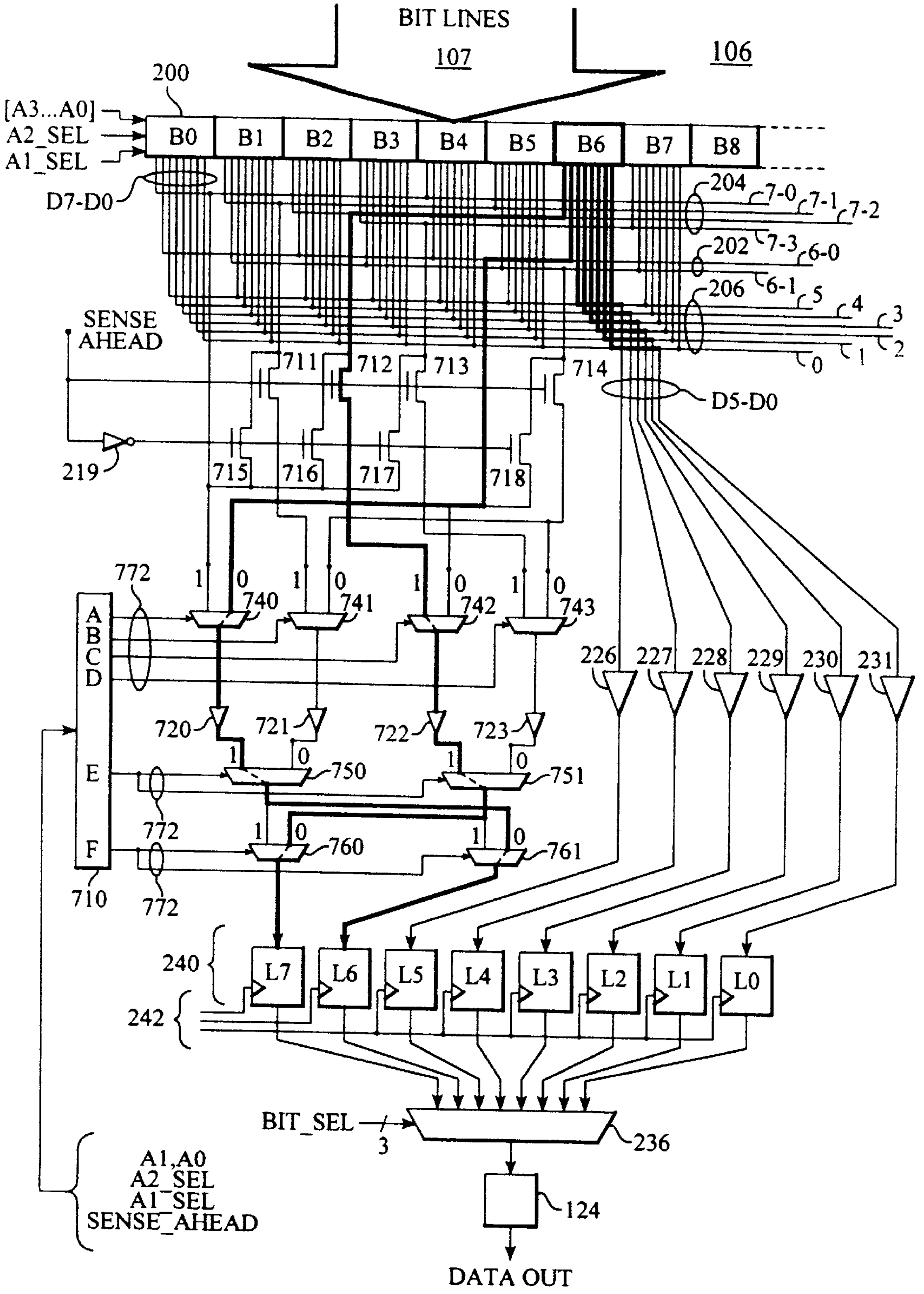

At the $A_0$ clock, the address of the target byte is completely known and decoder circuit 200 therefore produces byte B6. Control signals A–D remain unchanged from clock A1. In addition, mux controller 710 asserts the E and F control lines. The E control line is a function of $A_0$, selecting a line from each of the D6 and D7 pairs by operating mux's 750 and 751. In this case, since $A_0$ is "0", the "1" inputs of mux's 750, 751 are selected, thus producing the D6 and D7 lines from byte B6. Control line F operates mux's 760 and 761 to switch the D6 and D7 lines so that they feed into their appropriate positions in latch 240. The F signal is based on the $A_1$ address bit, since this bit determines how mux's 740–743 are paired off between the D6 and D7 data lines. FIG. 7D shows the active lines, including the D5–D0 data lines.

Figure 7E:
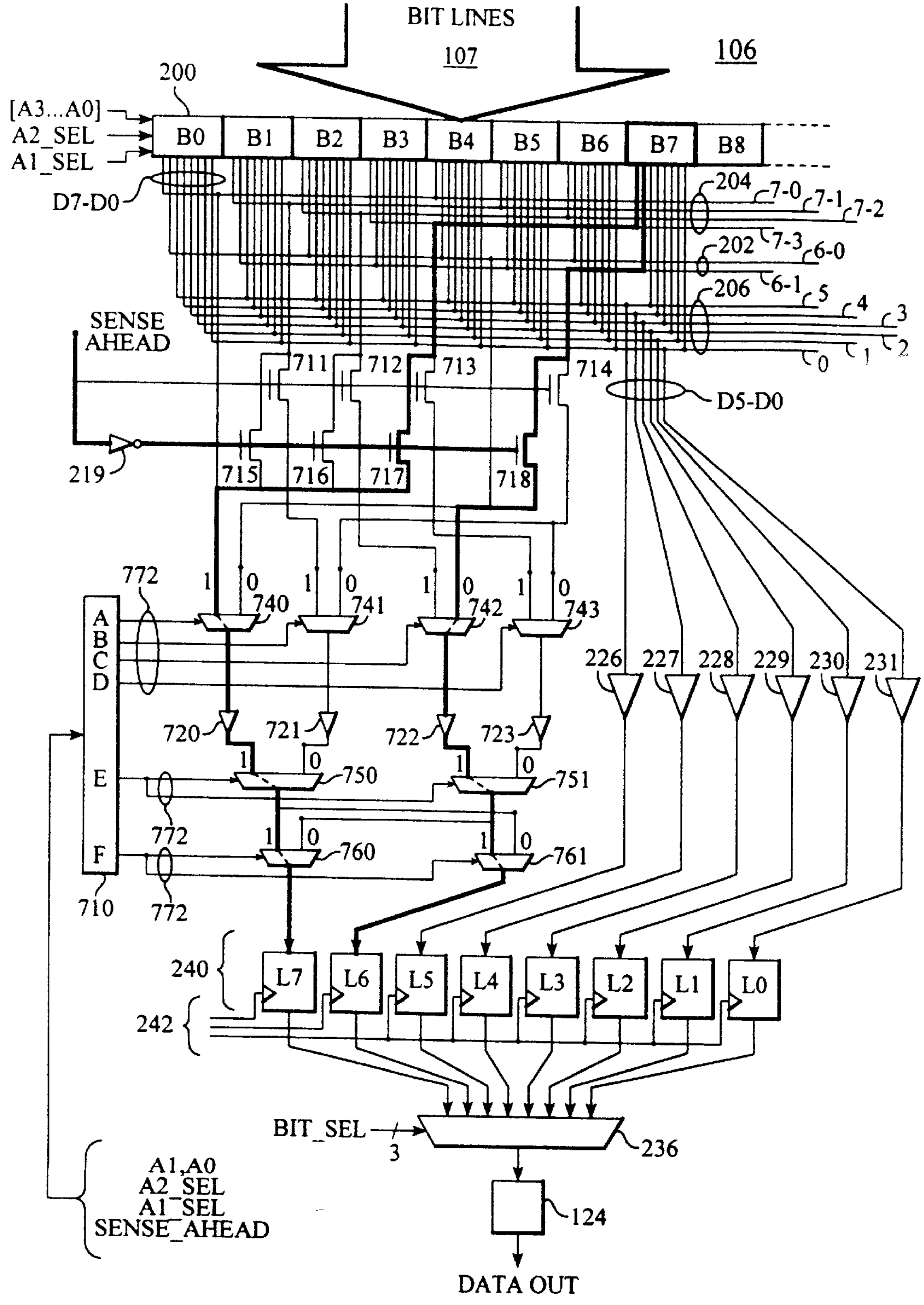

Finally, for subsequently accessed memory locations, the SENSE-AHEAD line is deasserted. This ties together the four wires 7-0 through 7-3 of four-wire bus 204 by virtue of transistors 711–713 being turned off and transistors 715–717 being turned on, feeding the wires into the "1" input of mux 740. Similarly, the two wires 6-0 and 6-1 are tied together through transistor 718 and fed into the "0" input of mux 742. Mux controller 710 selects the "1" input of mux's 740, 750 and 760 to feed the D7 line into sense circuit 720 into latch L7. Similarly, mux controller 710 selects the "0" input of mux 742 to feed the D6 line into sense circuit 722, and from there the "1" input of mux's 751 and 761 are selected to send the D6 line into the L6 latch. FIG. 7E shows the data flow for the subsequent byte, namely byte B7.

The embodiments of the invention shown in FIG. 2 and FIG. 7A respectively use twelve and ten sense circuits. The reduction of sense circuits achieved by the embodiment of FIG. 7A comes about by the use of multiplexing circuitry to selectively switch the data lines to certain sense circuits when they become available as subsequent bits of the address are clocked into the memory device.

Figure 8:
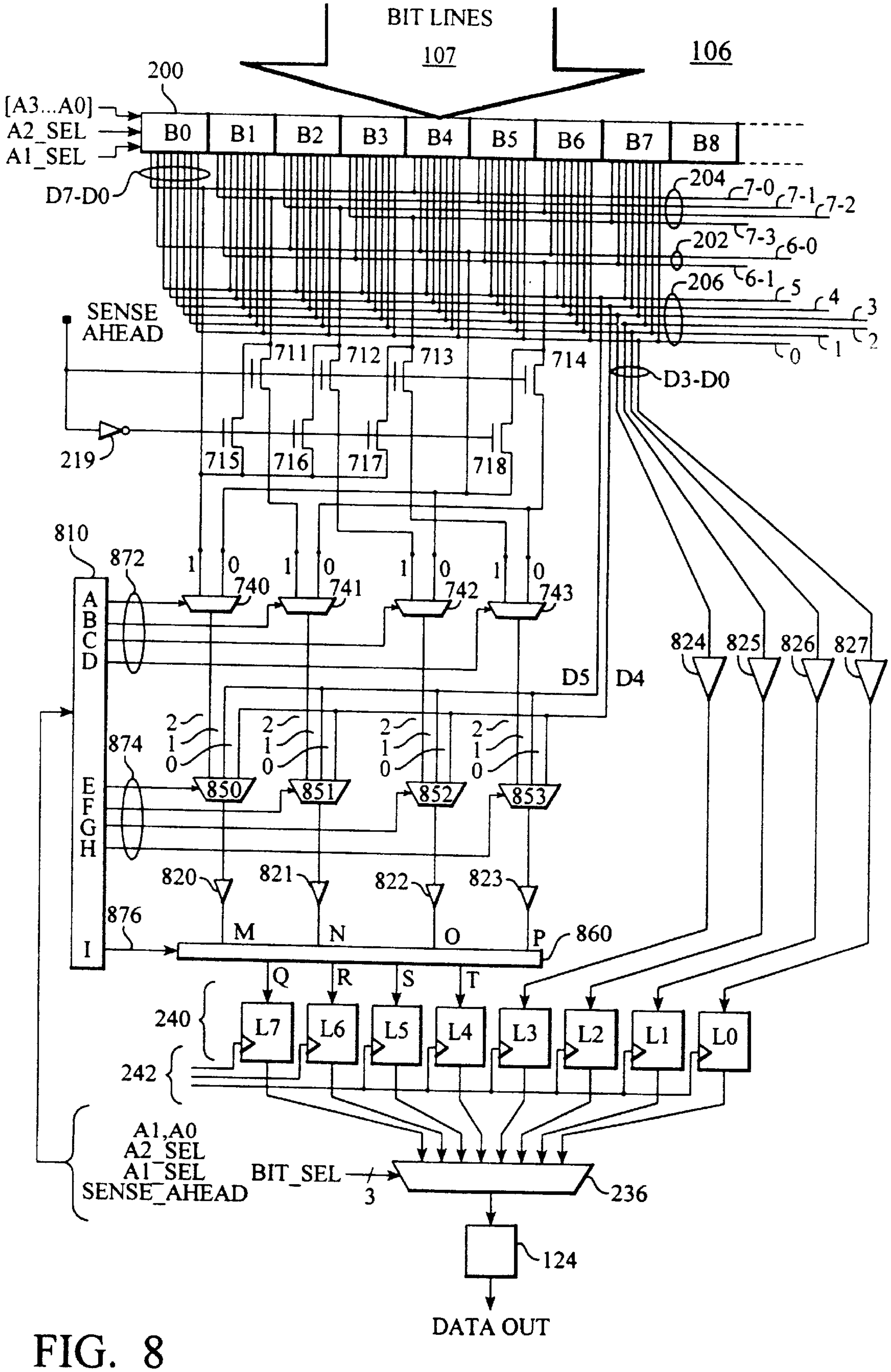
FIG. 8 shows a third embodiment of the Y decoder in accordance with the present invention.

FIG. 8 shows an embodiment which extends the principle of re-using sense circuits another step. Elements previously introduced and discussed in FIGS. 2 and 7A retain their reference numerals. FIG. 8 introduces an additional set of mux's 850–853. These mux's have three inputs: a "2" input, a "1" input, and a "0" input. Each mux 850–853 also has a two-bit selector input 874, where a "10" on selector input 874 produces the "2" input, a "01" on selector input 874 produces the "1" input, and a "00" on selector input 874 produces the "0" input.

The "2" inputs of mux's 850–853 are coupled respectively to the output of each mux 740–743. The "2" inputs therefore receive either a D7 data line or a D6 data line, depending on the selections made in mux's 740–743. The "1" and "0" inputs of mux's 850–853 are coupled respectively to the number 5 and number 4 wires of bus 206. The outputs of mux's 850–853 feed into inputs of sense circuits 820–823. As will be explained below, the presence of mux's 740–743 and 850–853 allow data lines D7, D6, D5 and D4 of the target byte to feed into the sense circuits, while still providing the predictive operating mode of the present invention.

Figure 9:
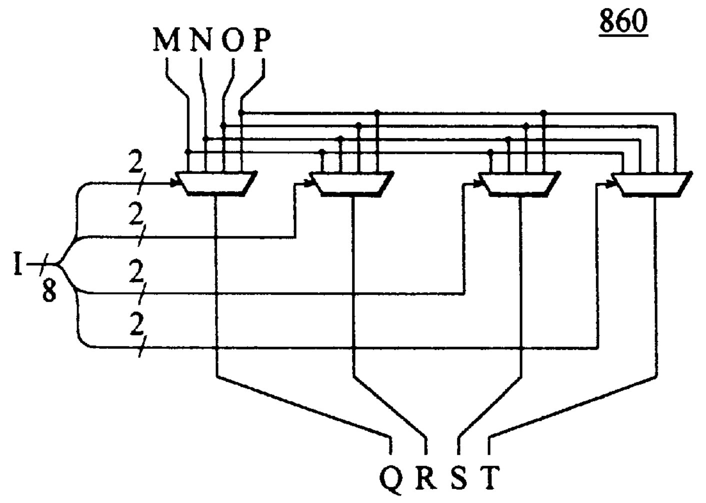
FIG. 9 is an implementation of the switching circuit shown in FIG. 8.

The outputs of the sense circuits feed into inputs M–P of switching circuit 860. The outputs Q–T of switch 860 respectively feed into the D7–D4 latches of data latch 240. Switching circuit 860 allows any input M–P to be switched to any output Q–T under the control of an eight-bit control line 860. FIG. 9 shows an implementation of such a switch.

Mux controller 810 provides control signals A–I which are coupled to mux selector inputs 872, 874, and 876. The control signals are functions of address bits $A_1$–$A_0$, control lines A2_SEL and A1_SEL, and the SENSE-AHEAD line. The signals A–I are defined by the following requirements for the non-predictive mode of operation, when SENSE-AHEAD is de-asserted: Pass transistors 711–713 are off and pass transistors 715–717 are on, thus tying together all the D7 data lines and feeding them into input “1” of mux 740. Likewise, pass transistor 714 is off and pass transistor 718 is on, thus tying together all the D6 data lines and feeding them into the “0” input of mux 742. Thus, in the non-predictive mode of operation, control signals A–I are asserted so that mux 740 produces its “1” input, mux 850 produces its “2” input, and switch 860 routes its M input to its Q output, resulting in the passage of data line D7 to the D7 data latch through sense circuit 820. Similarly, mux 742 produces its “0” input, mux 852 produces its “2” input and switch 860 routes its O input to its R output, resulting in the passage of data line D6 to the D6 data latch through sense circuit 822. At the same time, the number 5 wire of bus 206, which corresponds to the D5 data line, is routed through input “1” of mux 851 and coupled from input N of switch 860 to output S, so that the D5 data line is latched into the D5 latch through sense circuit 821. Finally, the number 4 wire of bus 206, which corresponds to the D4 data line, is routed through the “0” input of the 853 mux and coupled from input P of switch 860 to output T and hence into data latch D4 through sense circuit 823.

The control signals A–I of mux controller 810 are further defined by the following requirements during the predictive mode of operation (see also the timing chart of FIG. 4A), when SENSE-AHEAD is asserted: At the $A_2$ clock, when the four possible bytes are selected, mux 740–743 each produce its “1” input and mux’s 850–853 each produce its “2” input, thus presenting the four D7 data lines to their respective sense circuits 820–823 whereupon data sensing begins.

At the $A_1$ clock and depending on the $A_1$ address bit, one pair of mux’s, either mux’s 740 and 741 or mux’s 742 and 743, will continue to produce the “1” input, thus feeding two of the D7 lines to the next level of mux’s . The other pair will be switched to produce the “0” inputs, which now carry the two possible D6 data lines. Mux’s 850–853 continue to produce the “2” inputs. The effect is that two of the sense circuits will continue to sense the D7 data lines, while the D7 lines will have been de-coupled from the other two sense circuits in order to begin sensing the D6 data lines.

At the $A_0$ clock, when all the address bits are in, the target byte will be known and selected by decoder circuit 200. Two of the four mux’s 850–853 will be switched to produce the number 5 and number 4 wires of bus 206 and sensing of the D5 and D4 data lines will commence. At the same time sensing of the D3–D0 will also commence with sense circuits 824–827. Meanwhile, sensing of the D7 data line of the target byte will have completed and will be ready for output, and the D6 data line continues to be sensed. Finally, switch 860 is operated via control line 876 to provide the necessary cross-switching of inputs M–P to outputs Q–R to ensure that data lines D7–D4 are latched into their corresponding data latches.

The embodiments shown in FIGS. 2A, 7A, and 8 show that by the appropriate use of multiplexing circuitry, the sense circuitry requirements can be reduced. Alternative designs are possible, each having varying degrees of complexity and silicon real-estate requirements. The embodiment of FIG. 2A is straight-forward, but requires twelve sense circuits. The embodiment of FIG. 8 uses eight sense circuits, but requires additional mux’s and a more complex controller to operate the mux’s. Although the disclosed embodiments provide predictive sensing at the $A_2$ clock, the operation can begin at an earlier clock to realize even greater speed increases. The particular implementation approach will depend on making tradeoffs among factors including desired speed of the device, circuit complexity, memory size, die size, and power requirements.

The disclosed embodiment of the invention realizes a factor of five decrease in the time between clocking in the last bit of the target memory location and clocking out the first bit of the target, thus permitting a five time increase in clock speed. However, the principles disclosed herein can be used to realize a factor of seven decrease in time. In the foregoing discussion, the Y portion of the address consists of four bits, and the predictive operating mode of the invention begins after receiving the second bit of the Y portion. With respect to FIG. 4A, if prediction mode begins after receiving the first bit instead, then sensing of the D7 data line would begin on the $A_3$ clock, thus decreasing the time by a factor of seven. Necessary changes to the logic include modifying decoder circuit 200 to provide 16-to-8 eight decoding in addition to the three decoding modes described; the reason being that at the $A_3$ clock there will be eight candidate bytes. In addition, extra sense amps will be needed. Following the architecture of FIG. 2, eight sense amps will be required to sense the eight candidate D7 data lines, four sense amps will be needed to sense the four candidate D6 data lines, two sense amps to sense the two possible D5 data lines, and five sense amps to sense the D4–D0 data lines of the target byte; a grand total of nineteen sense amps. Following the architectures of FIGS. 7A and 8, this number of sense amps can be reduced with the use of additional mux’s to re-use sense amps which become available as the number of candidate targets decreases when additional address bits of the Y portion of the target address become available. On the one hand, the need for so many sense amps might be a deterrent to this approach. On the other hand, the time decrease might allow the use of slower but simpler (and thus smaller) sense amps which can offset the size requirement of having an increased number of sense amps.

Alternatively, the predictive operating mode can be delayed until all but the last bit of the target address has been clocked in. Thus with reference to FIG. 4A, sensing of the D7 data line will not commence until the $A_1$ clock, when bits $A_3$–$A_1$ are known. At that point, there are only two candidate bytes and so only two candidate D7 data lines to sense. In this configuration, nine sense amps are needed to realize a factor of three decrease in the time between receiving the target address and outputting the target memory location, which translates to a three time increase in the clock.

In the disclosed embodiment of the invention, only one bit is sensed ahead of time for each address bit received. Thus, with reference to FIGS. 2 and 4A, when address bit $A_2$ is received on the $A_2$ clock, predictive sensing of the four candidate D7 data lines begins. Upon receiving the next address bit, $A_3$, predictive sensing of the two candidate D6 data lines commences. In another embodiment of the invention, however, more than one data line per candidate byte can be sensed ahead of time without departing from the scope and spirit of the invention. For example, at the $A_2$ clock both the D7 and D6 data lines of the four candidate bytes can be sensed.

As a matter of convention, the preferred embodiment of the invention performed is predictive operation on the least significant bits of the target address, namely the Y portion of the address. However, the invention is readily adapted to operate on the most significant portion of the address instead, without departing from the principles of operation of the invention and without sacrificing the benefits made possible by the invention.

In accordance with requirements of the SPI protocol, the preferred embodiment of the invention operates on the most significant bits of the candidate bytes. Thus, the D7 data lines are sensed before sensing the D6 data lines and so on. This allows for the most significant bit to be shifted out first, per the SPI protocol. Alternatively, for a protocol other than SPI, the invention can be implemented to operate on the least significant bits first so that the least significant bit is outputted first. Thus, the D0 data lines of the candidate bytes can be sensed first, followed by the D1 data lines, and so on. This approach is consistent with the principles of operation of the invention and enjoys the same benefits as achieved by the embodiment of the invention disclosed above. With reference to FIGS. 2 and 3A, the logic comprising decoder circuit 200 can be adapted so that the bit zero lines are coupled to the D7 data lines, the bit one lines are coupled to the D6 data lines, the bit two lines are coupled to the D5 data lines and so forth, so that the low order bits of the candidate bytes are sensed first.

What is claimed is:

1. In a serial memory device having a plurality of memory locations, the content of each memory location consisting of a plurality of data bits, a method of reading out the contents of a target memory location comprising:

receiving a partial address of the target memory location;

for each memory location whose address contains the partial address, sensing less than all of its data bits;

receiving the remaining address bits thereby making known the target memory location;

sensing the remaining data bits of the target memory location while at the same time reading out the first data bit thereof; and after sensing the remaining data bits, reading out the remaining data bits.

2. The method of claim 1 wherein the step of sensing less than all of the data bits is a step of sensing only a first data bit, so that sensing the first bit of the target memory location commences before its address is received.

3. The method of claim 1 wherein the step of receiving a partial address includes receiving the first N address bits of the target memory location, N being less than the number of address bits constituting the address.

4. The method of claim 3 wherein the first N address bits are the N most significant address bits.

5. The method of claim 1 wherein the step of receiving a partial address is a step of receiving all but the last bit of the address, and the step of receiving the remaining address bits is a step of receiving the last bit of the address.

6. The method of claim 1 wherein the step of sensing less than all of the data bits is a step of sensing only a first data bit, and the step of receiving the remaining address bits includes:

receiving a next address bit of the target memory location to produce a second partial address; and for each memory location whose address contains the second partial address, sensing a second data bit thereof so that sensing of the second data bit of the target memory location commences before its address becomes known.

7. The method of claim 6 wherein the step of receiving a partial address includes receiving the first N address bits of the address of the target memory location so that the second partial address represents the first N+1 bits of the address, N+1 being less than the number of address bits constituting the address.

8. The method of claim 7 wherein the first and second data bits are respectively the first and second most significant data bits.

9. The method of claim 7 wherein the first N address bits are the most significant address bits.

10. The method of claim 1 wherein the step of sensing less than all of the data bits is a step of sensing only a first data bit, and the step of receiving the remaining address bits includes:

receiving the next-to-last address bit of the target memory location to produce a second partial address; and for each memory location whose address contains the second partial address, sensing a second data bit thereof so that sensing of the second data bit of the target memory location commences before its address becomes known;

receiving the last address bit of the target memory location to produce the entire address of the target memory location; and sensing the remaining data bits of the target memory location, wherein sensing of the first and second data bits thereof are in progress or have completed.

11. The method of claim 10 wherein the first and second data bits respectively are the most significant and second most significant data bits.

12. In a serial memory device having an array of memory locations arranged in rows and columns, each memory location having B bit lines and a unique address, each address represented by A bits, a method of sensing the content of a target memory location, comprising:

(i) serially receiving N address bits of the target memory location, $N<A$;

(ii) based on the N address bits, selecting a row of memory locations in the array;

(iii) serially receiving I additional address bits and selecting the bit lines corresponding to a first plurality of memory locations in the selected row, each such memory location having the same (N+I) bits in its address as the (N+I) received address bits, $(N+I)<A$;

(iv) for each memory location in the first plurality of memory locations, sensing a first subset of its bit lines;

(v) while sensing the first subset of bit lines of each memory location in the first plurality of memory locations, receiving a next address bit thereby reducing the first plurality of memory locations in number by one-half, resulting in a second plurality of memory locations; and (vi) for each memory location in the second plurality of memory locations, sensing a second subset of its bit lines.

13. The method of claim 12 wherein the sensing step of step (iv) includes sensing each of the bit lines in the first subsets by coupling them to a sensing circuit; wherein step (v) includes decoupling one-half of the first subsets of bit lines from the sense circuits, in response to receiving the next address bit, thus making available one-half of the sensing circuits; and wherein the sensing step of step (vi) includes sensing some of the bit lines in the second subsets by coupling them to the available sensing circuits.

14. The method of claim 12 wherein the first subset of bit lines of each memory location in the first plurality of memory locations consists only of the most significant bit of the memory location.

15. The method of claim 14 wherein the second subset of bit lines of each memory location in the second plurality of memory locations consists only of the first and second most significant bits of the memory location.

16. The method of claim 12 wherein the sensing step of step (iv) includes, for each of the memory locations in the first plurality, coupling a first one of its bit lines to one of F sense circuits, F being the number of memory locations in the first plurality.

17. The method of claim 16 wherein the sensing step of step (vi) includes selectively decoupling one-half of the first bit lines from the sense circuits and, for each of the memory locations in the second plurality, coupling a second one of its bit lines to the decoupled sense circuits.

18. The method of claim 17 wherein the first and second bit lines of each memory location are the two most significant bits.

19. A method of reading out a memory location in a serial memory device, comprising the steps of:

receiving a partial address of a target memory location;

producing on data lines the data bits of first memory locations whose addresses include the partial address;

coupling first data lines of the first memory locations to a first set of sense amplifiers;

receiving a next address bit to produce a second partial address, whereby the addresses of only one-half of the first memory locations include the second partial address thus eliminating the other half of the first memory locations;

coupling second data lines of the remaining one-half of the first memory locations to a second set of sense amplifiers; and receiving the remaining address bits to produce a complete address thus making known the target memory location; and coupling the data lines corresponding to the remaining data bits of the target memory location to a third set of sense amplifiers while at the same time outputting the first data line of the target memory location.

20. A method of reading out a memory location in a serial memory device, comprising the steps of:

receiving a partial address of a target memory location;

producing on data lines the data bits of first memory locations whose addresses include the partial address;

coupling first data lines of the first memory locations to a first set of sense amplifiers;

receiving a next address bit to produce a second partial address, whereby the addresses of only one-half of the first memory locations include the second partial address thus eliminating the other half of the first memory locations; and coupling second data lines of the remaining one-half of the first memory locations to a second set of sense amplifiers;

wherein the second set of sense amplifiers is included in the first set of sense amplifiers, and the step of coupling second data lines of the remaining half of the first memory locations includes decoupling the first data lines of the eliminated half of the first memory locations from their associated sense amplifiers, and coupling the second data lines to the decoupled sense amplifiers.

21. The method of claim 20 further including receiving the remaining address bits to produce a complete address thus making known the target memory location; and sensing remaining data bits of the target memory location while at the same time outputting the first data line of the target memory location.

22. The method of claim 21 wherein the step of receiving the remaining address bits eliminates at least one-half of the remaining half of the first memory locations; and the step of sensing remaining data bits of the target memory location includes decoupling the first data lines of the eliminated one-half of the remaining half of the first memory locations from their associated sense amplifiers and coupling at least one of the remaining data bits to one of the decoupled sense amplifiers.

23. In a serial memory device having a plurality of memory locations, the content of each memory location consisting of a plurality of data bits, a method of reading out the contents of a target memory location comprising:

receiving a first address of the target memory location, the first address being a partial address of the target memory location;

for each memory location whose address contains the first address, sensing less than all of its data bits;

during the step of sensing (i) receiving one or more additional address bits to produce a second address, thereby reducing the number of memory locations containing the first address and (ii) sensing one or more additional data bits of each of the reduced memory locations; and reading out data bits that have been sensed.

24. The method of claim 23 wherein the step of receiving one or more additional address bits is a step of receiving the remaining one or more address bits of the target memory location, and the step of sensing one or more additional data bits is a step of sensing the remaining one or more data bits of the target memory location.

* * * * *